(12) United States Patent
Horiuchi et al.

(10) Patent No.: US 12,159,759 B2
(45) Date of Patent: Dec. 3, 2024

(54) PHOTOELECTRIC CONVERSION ELEMENT, PHOTOELECTRIC CONVERSION MODULE, ELECTRONIC DEVICE, AND POWER SUPPLY MODULE

(71) Applicants: Tamotsu Horiuchi, Shizuoka (JP); Nozomu Tamoto, Shizuoka (JP); Yuuji Tanaka, Shizuoka (JP); Naomichi Kanei, Shizuoka (JP); Takahiro Ide, Shizuoka (JP)

(72) Inventors: Tamotsu Horiuchi, Shizuoka (JP); Nozomu Tamoto, Shizuoka (JP); Yuuji Tanaka, Shizuoka (JP); Naomichi Kanei, Shizuoka (JP); Takahiro Ide, Shizuoka (JP)

(73) Assignee: Ricoh Company, Ltd., Tokyo (JP)

( * ) Notice: Subject to any disclaimer, the term of this patent is extended or adjusted under 35 U.S.C. 154(b) by 16 days.

(21) Appl. No.: 17/906,339

(22) PCT Filed: Mar. 12, 2021

(86) PCT No.: PCT/JP2021/010104
§ 371 (c)(1),
(2) Date: Sep. 14, 2022

(87) PCT Pub. No.: WO2021/187373
PCT Pub. Date: Sep. 23, 2021

(65) Prior Publication Data
US 2023/0352250 A1 Nov. 2, 2023

(30) Foreign Application Priority Data
Mar. 16, 2020 (JP) .................................. 2020-045142
Mar. 17, 2020 (JP) .................................. 2020-046338
Mar. 11, 2021 (JP) .................................. 2021-039159

(51) Int. Cl.
*H01G 9/20* (2006.01)
*C08G 61/12* (2006.01)
*H10K 85/10* (2023.01)

(52) U.S. Cl.
CPC ........... *H01G 9/2009* (2013.01); *C08G 61/12* (2013.01); *H10K 85/111* (2023.02);
(Continued)

(58) Field of Classification Search
CPC ...... H01L 31/00–078; H10K 30/00–89; H10K 39/00–18; H01G 9/20–2095
(Continued)

(56) References Cited

U.S. PATENT DOCUMENTS 3,542,547 A 11/1970 Wilson
3,824,099 A 7/1974 Champ et al.
(Continued)

FOREIGN PATENT DOCUMENTS

EP 0892411 A2 1/1999
EP 0911841 A2 4/1999
(Continued)

OTHER PUBLICATIONS

JP-2006339199-A english translation (Year: 2006).*
(Continued)

*Primary Examiner* — Bach T Dinh
(74) *Attorney, Agent, or Firm* — Grüneberg and Myers PLLC

(57) ABSTRACT

A photoelectric conversion element including: first support; first electrode; electron-transporting layer; photoelectric conversion layer; hole-transporting layer; and second electrode, the hole-transporting layer including polymer including recurring unit of General Formula (1) below and compound of General Formula (2):

General Formula (1)

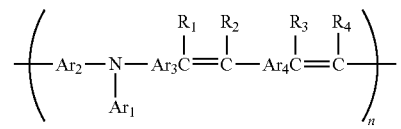

where $Ar_1$ represents aromatic hydrocarbon, which may have substituent; $Ar_2$ and $Ar_3$ each independently represent bivalent group of monocyclic aromatic hydrocarbon, non-condensed polycyclic aromatic hydrocarbon, or condensed polycyclic aromatic hydrocarbon,
(Continued)

which may have substituent; $Ar_4$ represents bivalent group of benzene, thiophene, biphenyl, anthracene, or naphthalene, which may have substituent; $R_1$ to $R_4$ each independently represent hydrogen, alkyl, or aryl; and n represents integer that is 2 or more and allows the polymer of General Formula (1) to have weight average molecular weight of 2,000 or more; and General Formula (2)

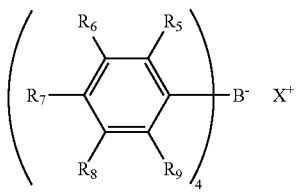

where $R_5$ to $R_9$, which may be identical or different, represent hydrogen, halogen, alkyl, alkoxy, or aryl; and X represents a cation.

19 Claims, 5 Drawing Sheets

(52) U.S. Cl.
CPC ..... *H10K 85/151* (2023.02); *C08G 2261/124* (2013.01); *C08G 2261/1412* (2013.01); *C08G 2261/1424* (2013.01); *C08G 2261/148* (2013.01); *C08G 2261/18* (2013.01); *C08G 2261/228* (2013.01); *C08G 2261/312* (2013.01); *C08G 2261/3162* (2013.01); *C08G 2261/91* (2013.01)

(58) Field of Classification Search
USPC .................................. 136/243–265
See application file for complete search history.

(56) References Cited

U.S. PATENT DOCUMENTS

| | | | |
|---|---|---|---|
| 4,123,269 | A | 10/1978 | Von Hoene et al. |
| 4,150,987 | A | 4/1979 | Anderson et al. |
| 5,463,057 | A | 10/1995 | Graetzel et al. |
| 6,028,265 | A | 2/2000 | Ono et al. |
| 6,153,824 | A | 11/2000 | Takada et al. |
| 6,278,056 | B1 | 8/2001 | Sugihara et al. |
| 9,318,270 | B2 | 4/2016 | Horiuchi et al. |
| 2004/0099306 | A1 | 5/2004 | Hara et al. |
| 2004/0256002 | A1 | 12/2004 | Horiuchi et al. |
| 2007/0051403 | A1 | 3/2007 | Itami |
| 2007/0085051 | A1 | 4/2007 | Sohn et al. |
| 2011/0291082 | A1 | 12/2011 | Terao et al. |
| 2012/0264343 | A1 | 10/2012 | Wienke et al. |
| 2013/0001476 | A1 | 1/2013 | Blouin et al. |
| 2014/0000677 | A1* | 1/2014 | Isobe .............. H01G 9/2081 438/98 |
| 2014/0299864 | A1 | 10/2014 | Urano et al. |
| 2015/0129034 | A1* | 5/2015 | Snaith .............. H10K 30/151 136/258 |
| 2017/0018369 | A1 | 1/2017 | Nakamura et al. |
| 2017/0018371 | A1 | 1/2017 | Suzuka et al. |
| 2017/0309407 | A1 | 10/2017 | Suzuka et al. |
| 2021/0296603 | A1 | 9/2021 | Arai et al. |
| 2021/0366662 | A1 | 11/2021 | Horiuchi et al. |

FOREIGN PATENT DOCUMENTS

| | | |
|---|---|---|
| EP | 1049117 A2 | 11/2000 |
| EP | 1052661 A2 | 11/2000 |
| EP | 1083582 A2 | 3/2001 |
| JP | 34-005466 | 6/1959 |
| JP | 45-000555 | 1/1970 |
| JP | 52-004188 | 2/1977 |
| JP | 54-058445 | 5/1979 |
| JP | 55-042380 | 10/1980 |
| JP | 56-123544 | 9/1981 |
| JP | 58-065440 | 4/1983 |
| JP | 60-098437 | 6/1985 |
| JP | 02-250881 | 10/1990 |
| JP | 07-500630 | 1/1995 |
| JP | 09-199744 | 7/1997 |
| JP | 10-092477 | 4/1998 |
| JP | 10-093118 | 4/1998 |
| JP | 10-233238 | 9/1998 |
| JP | 11-086916 | 3/1999 |
| JP | 11-204821 | 7/1999 |
| JP | 11-214730 | 8/1999 |
| JP | 11-214731 | 8/1999 |
| JP | 11-238905 | 8/1999 |
| JP | 11-265738 | 9/1999 |
| JP | 11-273754 | 10/1999 |
| JP | 11-273755 | 10/1999 |
| JP | 2000-026487 | 1/2000 |
| JP | 2000-106224 | 4/2000 |
| JP | 2000-323191 | 11/2000 |
| JP | 2001-052766 | 2/2001 |
| JP | 2001-059062 | 3/2001 |
| JP | 2001-076773 | 3/2001 |
| JP | 2001-076775 | 3/2001 |
| JP | 2001-257012 | 9/2001 |
| JP | 2002-164089 | 6/2002 |
| JP | 2003-007359 | 1/2003 |
| JP | 2003-007360 | 1/2003 |
| JP | 2003-031273 | 1/2003 |
| JP | 2003-264010 | 9/2003 |
| JP | 2004-063274 | 2/2004 |
| JP | 2004-095450 | 3/2004 |
| JP | 2004-115636 | 4/2004 |
| JP | 2004-200068 | 7/2004 |
| JP | 2004-235052 | 8/2004 |
| JP | 2005-101493 | 4/2005 |
| JP | 2006-032260 | 2/2006 |
| JP | 2006-339199 | 12/2006 |
| JP | 2006339199 A * | 12/2006 |
| JP | 2007-115665 | 5/2007 |
| JP | 2007-248962 | 9/2007 |
| JP | 2010-059417 | 3/2010 |
| JP | 2010-192474 | 9/2010 |
| JP | 2010192474 A * | 9/2010 |
| WO | WO2010/030450 A1 | 3/2011 |
| WO | WO2011/045321 A1 | 4/2011 |
| JP | 2013-033868 | 2/2013 |
| JP | 2013211149 A * | 10/2013 |
| JP | 2014-072327 | 4/2014 |
| JP | 2014146534 A * | 8/2014 |
| JP | 2015-119023 | 6/2015 |
| JP | 2015-177037 | 10/2015 |
| JP | 2016-143708 | 8/2016 |
| JP | 2016-195175 | 11/2016 |
| JP | 2017-011066 | 1/2017 |
| JP | 2017-022354 | 1/2017 |
| JP | 2017-022355 | 1/2017 |
| JP | 2017-069508 | 4/2017 |
| JP | 2017-098372 | 6/2017 |
| JP | 2017-126676 | 7/2017 |
| JP | 2017-143150 | 8/2017 |
| JP | 2017-199893 | 11/2017 |
| JP | 2018-066622 | 1/2018 |
| JP | 2019-68056 | 4/2019 |
| JP | 2019-075487 | 5/2019 |
| JP | 2019-165073 | 9/2019 |
| JP | 2020-025068 | 2/2020 |
| JP | 2020-053616 | 4/2020 |
| WO | WO2004/063283 A1 | 7/2004 |
| WO | WO2013/042699 A1 | 3/2013 |

(56) References Cited

FOREIGN PATENT DOCUMENTS

WO     WO2013/121835 A1     8/2013
WO     2015/159755     10/2015

OTHER PUBLICATIONS

JP-2010192474-A english translation (Year: 2010).*
JP-2014146534-A english translation (Year: 2014).*
JP-2013211149-A English (Year: 2013).*
Extended Search Report dated Jul. 26, 2023, in European Patent Application No. 21771353.6, 9 pages.
Tsai et al., "Triarylamine-based crosslinked hole-transporting material with an ionic dopant for high-performance PEDOT:PSS-free polymer solar cells", Journal of Materials Chemistry C., vol. 3, 2015, pp. 6158-6165.
International Search Report Issued May 18, 2021 for counterpart International Patent Application No. PCT/JP2021/010104 filed Mar. 12, 2021.
Yokoyama, Takamichi et al., Overcoming Short-Circuit in Lead-Free $CH_3NH_3SnI_3$ Perovskite Solar Cells via Kinetically Controlled Gas-Solid Reaction Film Fabrication Process, The Journal of Physical Chemistry Letters, Feb. 15, 2016, 2016, vol. 7, pp. 776-782.
Suyoung Hwang, et al., "A highly efficient organic sensitizer for dye-sensitized solar cells", Chem. Commun., 4887-4889 (2007).
Tamotsu Horiuchi, et al., "High Efficiency of Dye-Sensitized Solar Cells Based on Metal-Free Indoline Dyes", J. Am. Chem. Soc., 12218-12219, vol. 126 (2004).
Daibin Kuang, et al., "Organic Dye-Sensitized Ionic Liquid Based Solar Cells: Remarkable Enhancement in Performance through Molecular Design of Indoline Sensitizers", Angew. Chem. Int. Ed., 1923-1927, vol. 47 (2008).
K. Kalyanasundaram, et al., "Sensitization of $TIO_2$ in the Visible Light Region Using Zinc Porphyrins", J. Phys. Chem., 2342-2347, vol. 91 (1987).
Andreas Kay and Michael Grätzel, "Artificial Photosynthesis. 1. Photosensitization of $TIO_2$ Solar Cells with Chlorophyll Derivatives and Related Natural Porphyrins", J. Phys. Chem., 6272-6277, vol. 97 (1993).
T. Ma et al., "Photoelectrochemical properties of $TIO_2$ electrodes sensitized by porphyrin derivatives with different numbers of carboxyl groups", Journal of Electroanalytical Chemistry, 31-38, vol. 537 (2002).
Paidi Yella Reddy, et al., "Efficient Sensitization of Nanocrystalline TIO2 Films by a Near-IR-Absorbing Unsymmetrical Zinc Phthalocyanine", Angew. Chem. Int. Ed., 373-376, vol. 46 (2007).
Seung Hun Eom, et al., "Roles of Interfacial Modifiers In Hybrid Solar Cells: Inorganic/Polymer Bilayer vs Inorganic/Polymer:Fullerene Bulk Heterojunction", ACS Appl. Mater. Interfaces 2014, 6, 803-810.
Japanese Office Action dated Feb. 27, 2024, in Japanese Application No. 2020-045142, 3 pages.
Japanese Office Action dated Jul. 23, 2024, in Japanese Application No. 2020-045142, 3 pages.

* cited by examiner

[Fig. 1]
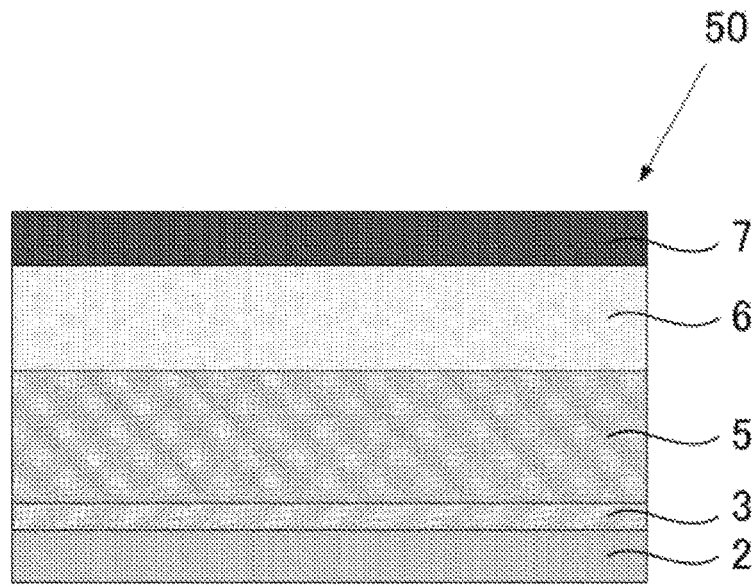
[Fig. 2]
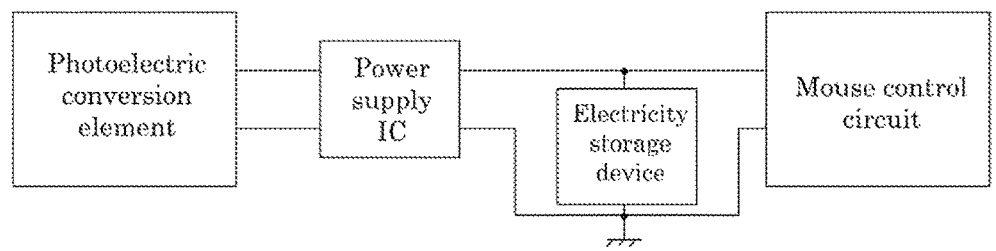
[Fig. 3]
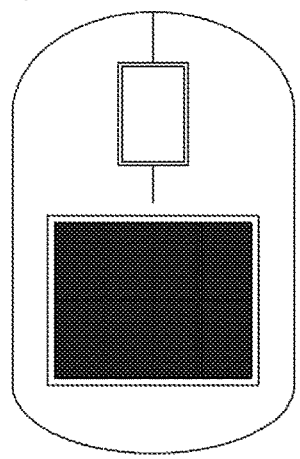
[Fig. 4]
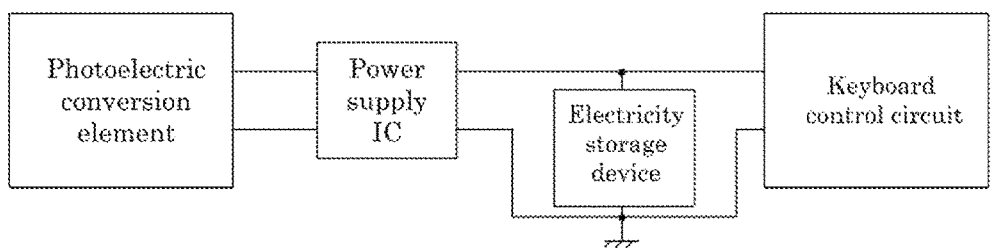

[Fig. 5]
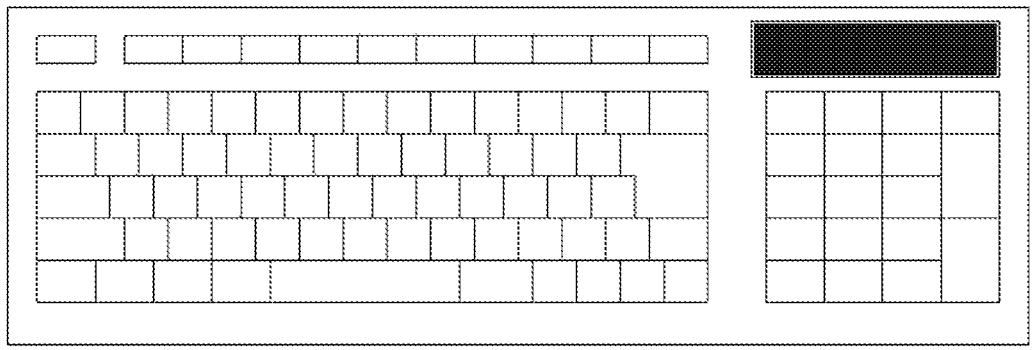
[Fig. 6]
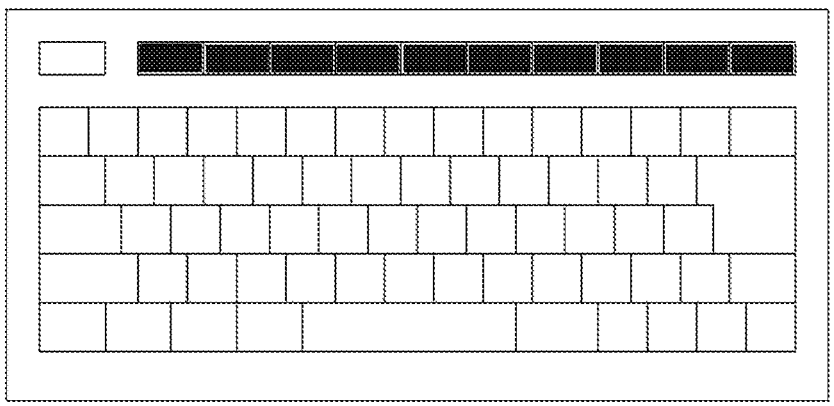

FIG. 8
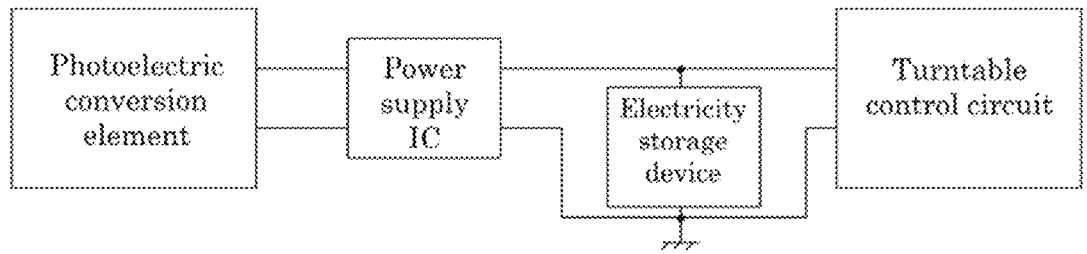
FIG. 9
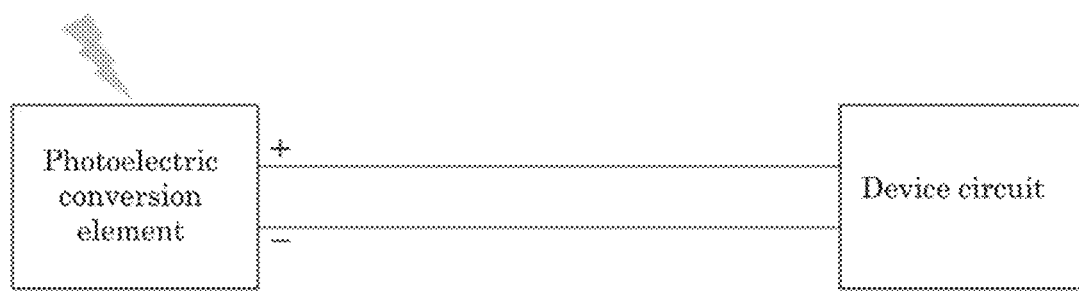
FIG. 10
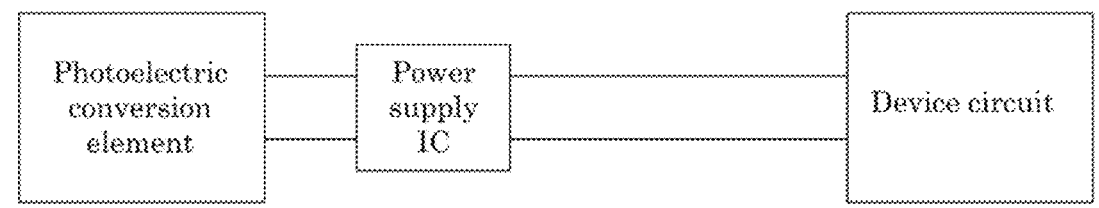
FIG. 11
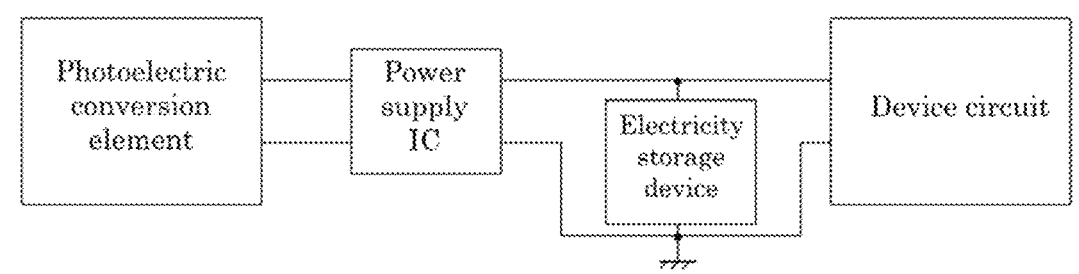
[FIG. 12
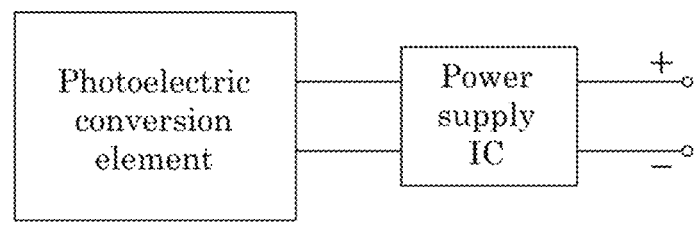

[FIG. 13]
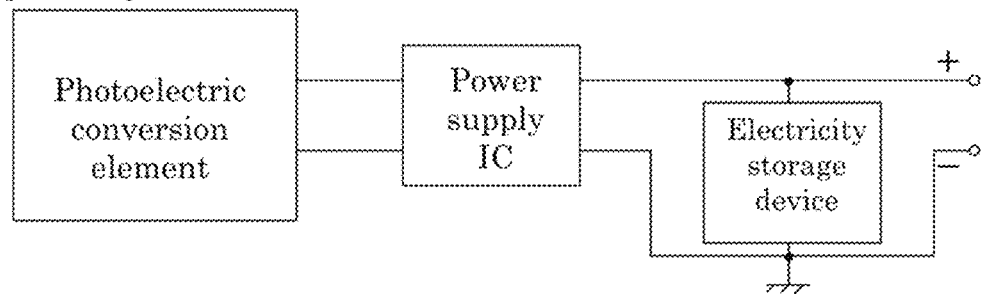

PHOTOELECTRIC CONVERSION ELEMENT, PHOTOELECTRIC CONVERSION MODULE, ELECTRONIC DEVICE, AND POWER SUPPLY MODULE

CROSS-REFERENCE TO RELATED APPLICATIONS

This application is the National Stage entry under § 371 of International Application No. PCT/JP2021/010104, filed on Mar. 12, 2021, and which claims the benefit of priority to Japanese Application No. 2020-045142, filed on Mar. 16, 2020; priority to Japanese Application No. 2020-046338, filed on Mar. 17, 2020; and priority to Japanese Application No. 2021-039159, filed on Mar. 11, 2021. The content of each of these applications is hereby incorporated by reference in its entirety.

TECHNICAL FIELD

The present disclosure relates to a photoelectric conversion element, a photoelectric conversion module, an electronic device, and a power supply module.

BACKGROUND ART

In recent years, solar cells using a photoelectric conversion element have been expected to be widely applied not only in terms of alternative to fossil fuels and measures against global warming but also as self-supporting power supplies that require neither replacement of a cell nor power source wirings. Moreover, the solar cells as the self-supporting power supplies attract much attention as one of energy harvesting techniques required in internet of things (IoT) devices or artificial satellites.

Examples of the solar cells include organic solar cells such as dye-sensitized solar cells, organic thin film solar cells, and perovskite solar cells, as well as inorganic solar cells using silicon that have been widely conventionally used. The perovskite solar cells are advantageous in terms of improvement of safety and inhibition of production cost, because they can be produced with the conventionally existing printing units without using an electrolyte containing, for example, an organic solvent.

Regarding the organic thin film solar cells and the perovskite solar cells, it is known that a plurality of photoelectric conversion elements that are spatially separated are electrically connected so as to form a series circuit to increase output voltage (see, for example, PTL 1).

CITATION LIST

Patent Literature

PTL 1: Japanese Unexamined Patent Application Publication No. 2016-195175

SUMMARY OF INVENTION

Technical Problem

An object of the present disclosure is to provide a photoelectric conversion element that can maintain a power generation efficiency even after exposure to light of a high illuminance for a long period of time.

Solution to Problem

According to one aspect of the present disclosure, a photoelectric conversion element includes: a first support; a first electrode; an electron-transporting layer; a photoelectric conversion layer; a hole-transporting layer; and a second electrode.

The hole-transporting layer includes a polymer including a recurring unit represented by General Formula (1) below and a compound represented by General Formula (2) below.

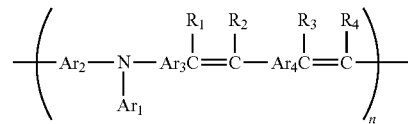

General Formula (1)

In the General Formula (1), $Ar_1$ represents an aromatic hydrocarbon group, and the aromatic hydrocarbon group may be substituted with a substituent; $Ar_2$ and $Ar_3$ each independently represent a bivalent group of a monocyclic aromatic hydrocarbon group, a non-condensed polycyclic aromatic hydrocarbon group, or a condensed polycyclic aromatic hydrocarbon group, which may be substituted with a substituent; $Ar_4$ represents a bivalent group of benzene, thiophene, biphenyl, anthracene, or naphthalene, which may be substituted with a substituent; $R_1$ to $R_4$ each independently represent a hydrogen atom, an alkyl group, or an aryl group; and n represents an integer that is 2 or more and allows the polymer represented by the General Formula (1) to have a weight average molecular weight of 2,000 or more.

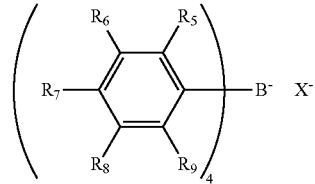

General Formula (2)

In the General Formula (2), $R_5$ to $R_9$, which may be identical to or different from each other, represent a hydrogen atom, a halogen atom, an alkyl group, an alkoxy group, or an aryl group; and X represents a cation.

Advantageous Effects of Invention

According to the present disclosure, it is possible to provide a photoelectric conversion element that can maintain a power generation efficiency even after exposure to light of a high illuminance for a long period of time.

BRIEF DESCRIPTION OF DRAWINGS

FIG. 1 is a schematic view of one example of a solar battery cell as one embodiment of a photoelectric conversion element.

FIG. 2 is a block diagram of a mouse for a personal computer as one example of an electronic device of the present disclosure.

FIG. 3 is a schematic external view presenting one example of the mouse presented in FIG. 2.

FIG. 4 is a block diagram of a keyboard for a personal computer as one example of an electronic device of the present disclosure.

FIG. 5 is a schematic external view presenting one example of the keyboard presented in FIG. 4.

FIG. 6 is a schematic external view presenting another example of the keyboard presented in FIG. 4.

FIG. 8 is a block diagram of a turntable as one example of an electronic device of the present disclosure.

FIG. 9 is a block diagram presenting one example of an electronic device of the present disclosure.

FIG. 10 is a block diagram presenting one example where a power supply integrated circuit (IC) is further incorporated into the electronic device presented in FIG. 9.

FIG. 11 is a block diagram presenting one example where an electricity storage device is further incorporated into the electronic device presented in FIG. 10.

FIG. 12 is a block diagram presenting one example of a power supply module of the present disclosure.

FIG. 13 is a block diagram presenting one example where an electricity storage device is further incorporated into the power supply module presented in FIG. 12.

DESCRIPTION OF EMBODIMENTS (Photoelectric Conversion Element)

Figure 7:
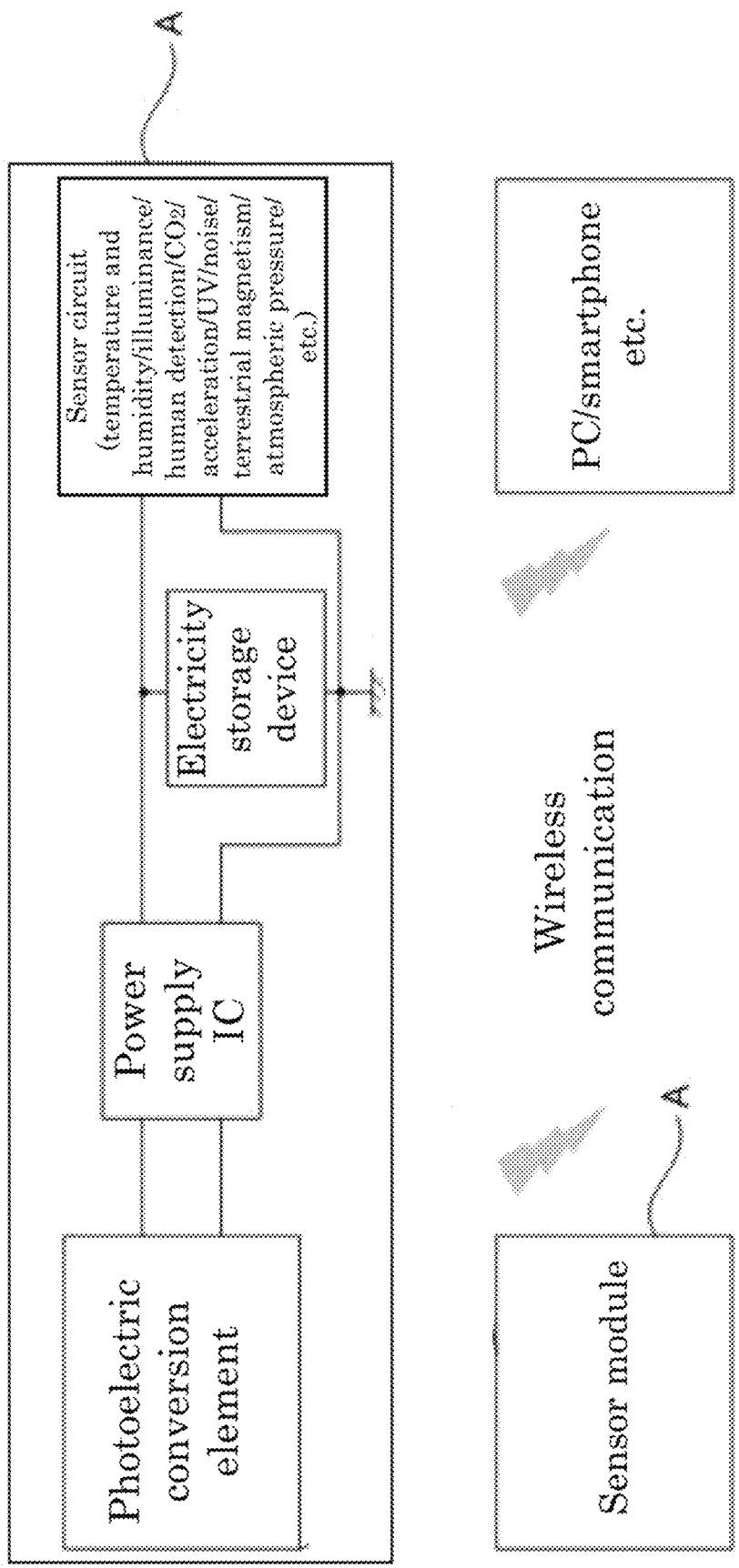
FIG. 7 is a block diagram of a sensor as one example of an electronic device of the present disclosure.

A photoelectric conversion element means an element that can convert light energy into electric energy or can convert electric energy into light energy, and is applied to, for example, solar cells and photodiodes.

A photoelectric conversion element of the present disclosure includes at least a first support, a first electrode, an electron-transporting layer, a photoelectric conversion layer, a hole-transporting layer, and a second electrode, and further includes other members if necessary.

<First Electrode>

A shape and size of the first electrode are not particularly limited and may be appropriately selected depending on the intended purpose.

A structure of the first electrode is not particularly limited and may be appropriately selected depending on the intended purpose. The structure of the first electrode may be a single layer structure or a structure where a plurality of materials are stacked.

A material of the first electrode is not particularly limited and may be appropriately selected depending on the intended purpose, so long as the material has conductivity. Examples of the material include transparent conductive metal oxides, carbon, and metals.

Examples of the transparent conductive metal oxide include indium-tin oxide (referred to as "ITO" hereinafter), fluorine-doped tin oxide (referred to as "FTO" hereinafter), antimony-doped tin oxide (referred to as "ATO" hereinafter), niobiumdoped tin oxide (referred to as "NTO" hereinafter), aluminum-doped zinc oxide (referred to as "AZO" hereinafter), indium-zinc oxide, and niobium-titanium oxide.

Examples of the carbon include carbon black, carbon nanotube, graphene, and fullerene.

Examples of the metal include gold, silver, aluminum, nickel, indium, tantalum, and titanium.

These may be used alone or in combination. Among them, transparent conductive metal oxide having high transparency is preferable, and ITO, FTO, ATO, NTO, and AZO are more preferable.

An average thickness of the first electrode is not particularly limited and may be appropriately selected depending on the intended purpose. The average thickness of the first electrode is preferably 5 nm or more but 100 micrometers or less, more preferably 50 nm or more but 10 micrometers or less. When a material of the first electrode is carbon or metal, the average thickness of the first electrode is preferably an average thickness enough for obtaining translucency.

The first electrode can be formed by known methods such as the sputtering method, the vapor deposition method, and the spray method.

Moreover, the first electrode is preferably formed on the substrate. It is possible to use an integrated commercially available product where the first electrode has been formed on the substrate in advance.

Examples of the integrated commercially available product include FTO-coated glass, ITO-coated glass, zinc oxide/aluminum coated glass, an FTO-coated transparent plastic film, and an ITO-coated transparent plastic film. Other examples of the integrated commercially available product include: glass substrates provided with a transparent electrode where tin oxide or indium oxide is doped with a cation or an anion having a different atomic value; and glass substrates provided with a metal electrode having such a structure that allows light in the form of a mesh or stripes to pass.

These may be used alone, or two or more products may be used in combination as a mixture or a laminate. Moreover, a metal lead wire may be used in combination in order to decrease an electric resistance value.

In order to produce a photoelectric conversion module that will be described hereinafter, an electrode of an integrated commercially available product may be appropriately processed to produce a substrate on which a plurality of first electrodes are formed.

A material of the metal lead wire is, for example, aluminum, copper, silver, gold, platinum, and nickel.

The metal lead wire can be used in combination by forming it on the substrate through, for example, the vapor deposition method, the sputtering method, or the pressure bonding method, and disposing a layer of ITO or FTO thereon, or by forming it on ITO or FTO.

<Electron-Transporting Layer>

The electron-transporting layer means a layer that transports, to the first electrode, electrons generated in a photoelectric conversion layer that will be described hereinafter. Therefore, the electron-transporting layer is preferably disposed adjacent to the first electrode.

A shape and size of the electron-transporting layer are not particularly limited and may be appropriately selected depending on the intended purpose.

A structure of the electron-transporting layer may be a single layer or may be a multilayer in which a plurality of layers are stacked.

The electron-transporting layer includes an electron-transporting material.

The electron-transporting material is not particularly limited and may be appropriately selected depending on the intended purpose. Examples of the electron-transporting material include semiconductor materials.

The semiconductor material is not particularly limited and known materials may be used. Examples of the semiconductor material include simple substance semiconductors and compounds having compound semiconductors.

Examples of the simple substance semiconductor include silicon and germanium.

Examples of the compound semiconductor include chalcogenides of metal.

Examples of the chalcogenides of metal include oxides of metal (oxide semiconductor), sulfides of metal, selenides of metal, and tellurides of metal.

Examples of the oxides of metal (oxide semiconductor) include oxides of titanium, tin, zinc, iron, tungsten, zirconium, hafnium, strontium, indium, cerium, yttrium, lanthanum, vanadium, niobium, and tantalum.

Examples of the sulfides of metal include sulfides of cadmium, zinc, lead, silver, antimony, and bismuth.

Examples of the selenides of metal include selenides of cadmium and lead.

Examples of the tellurides of metal include telluride of cadmium.

Other examples of the compound semiconductor include: phosphides of zinc, gallium, indium, and cadmium; gallium arsenide; copper-indium-selenide; and copperindium-sulfide.

Among them, metal oxides (oxide semiconductor) are preferable. Particularly, it is preferable to include at least one selected from the group consisting of titanium oxide, zinc oxide, tin oxide, and niobium oxide. Inclusion of tin oxide is particularly preferable.

These may be used alone or in combination. Moreover, a crystal type of the semiconductor material is not particularly limited and may be appropriately selected depending on the intended purpose. The crystal type thereof may be a single crystal, polycrystalline, or amorphous.

The electron-transporting layer includes, on the electron-transporting material on a surface thereof at a side of the photoelectric conversion layer, at least one compound selected from the group consisting of a phosphonic acid compound, a boronic acid compound, a sulfonic acid compound, a halogenated silyl compound, and an alkoxysilyl compound. When the electron-transporting layer includes the aforementioned compound on the surface of the electron-transporting material at the side of the photoelectric conversion layer, it can be expected that the physical characteristics of the boundary between the electron-transporting layer and the photoelectric conversion layer can be controlled. In other words, when the electron-transporting material is covered with these compounds on the surface of the electron-transporting layer at the side of the photoelectric conversion layer, it can be expected that a boundary resistance between the electron-transporting layer and the photoelectric conversion layer is decreased, to make the electron transfer smooth.

These compounds may be bound to the electron-transporting material. Examples of the bond include a covalent bond and an ionic bond.

The compound is at least one selected from the group consisting of phosphonic acid compounds, boronic acid compounds, sulfonic acid compounds, halogenated silyl compounds, and alkoxysilyl compounds.

The compound preferably includes a nitrogen atom in terms of compatibility with the perovskite layer.

The phosphonic acid compound is not particularly limited and may be appropriately selected depending on the intended purpose so long as it includes a phosphonic acid group. Specific examples of the phosphonic acid compound will be described later.

The boronic acid compound is not particularly limited and may be appropriately selected depending on the intended purpose so long as it includes a boronic acid group. Specific examples of the boronic acid compound will be described later.

The sulfonic acid compound is not particularly limited and may be appropriately selected depending on the intended purpose so long as it includes a sulfonic acid group. Specific examples of the sulfonic acid compound will be described later.

The halogenated silyl compound is not particularly limited and may be appropriately selected depending on the intended purpose so long as it includes a halogenated silyl group. Specific examples of the halogenated silyl compound will be described later.

The alkoxysilyl compound is not particularly limited and may be appropriately selected depending on the intended purpose so long as it includes an alkoxysilyl group. Specific examples of the alkoxysilyl compound will be described later.

A molecular weight of the compound is not particularly limited and may be appropriately selected depending on the intended purpose. The molecular weight of the compound is, for example, 100 or more but 500 or less.

The compound is represented by, for example, the following General Formula (3).

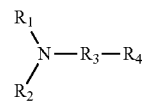

General Formula (3)

In the General Formula (3), $R_1$ and $R_2$, which may be identical to or different from each other, represent a hydrogen atom, an alkyl group, an aryl group, or a heterocycle, $R_3$ represents a bivalent alkylene group, a bivalent aryl group, or a bivalent heterocycle, $R_4$ represents a phosphonic acid group, a boronic acid group, a sulfonic acid group, a halogenated silyl group, or an alkoxysilyl group, and $R_1$ or $R_2$, $R_3$, and N may be joined together to form a ring structure.

Examples of the compound include the following compounds.

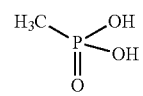

(A-01)

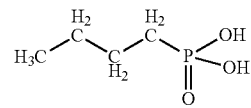

(A-02)

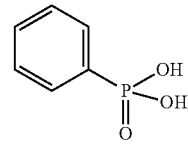

(A-03)

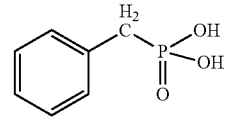

(A-04)

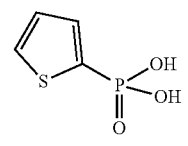

(A-05)

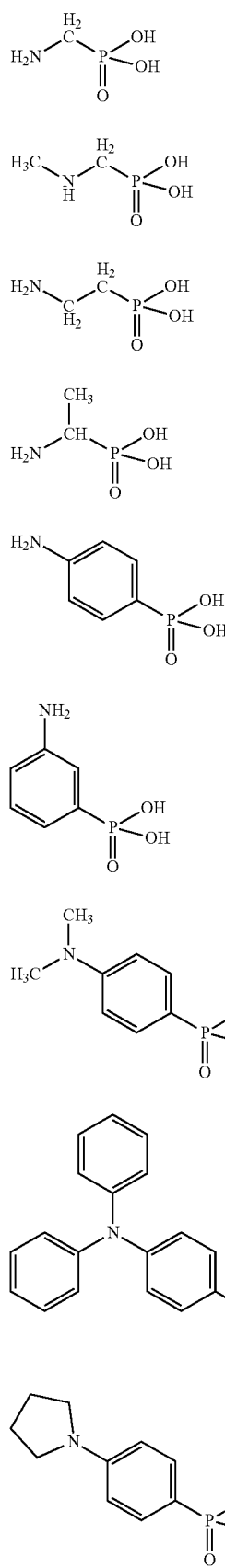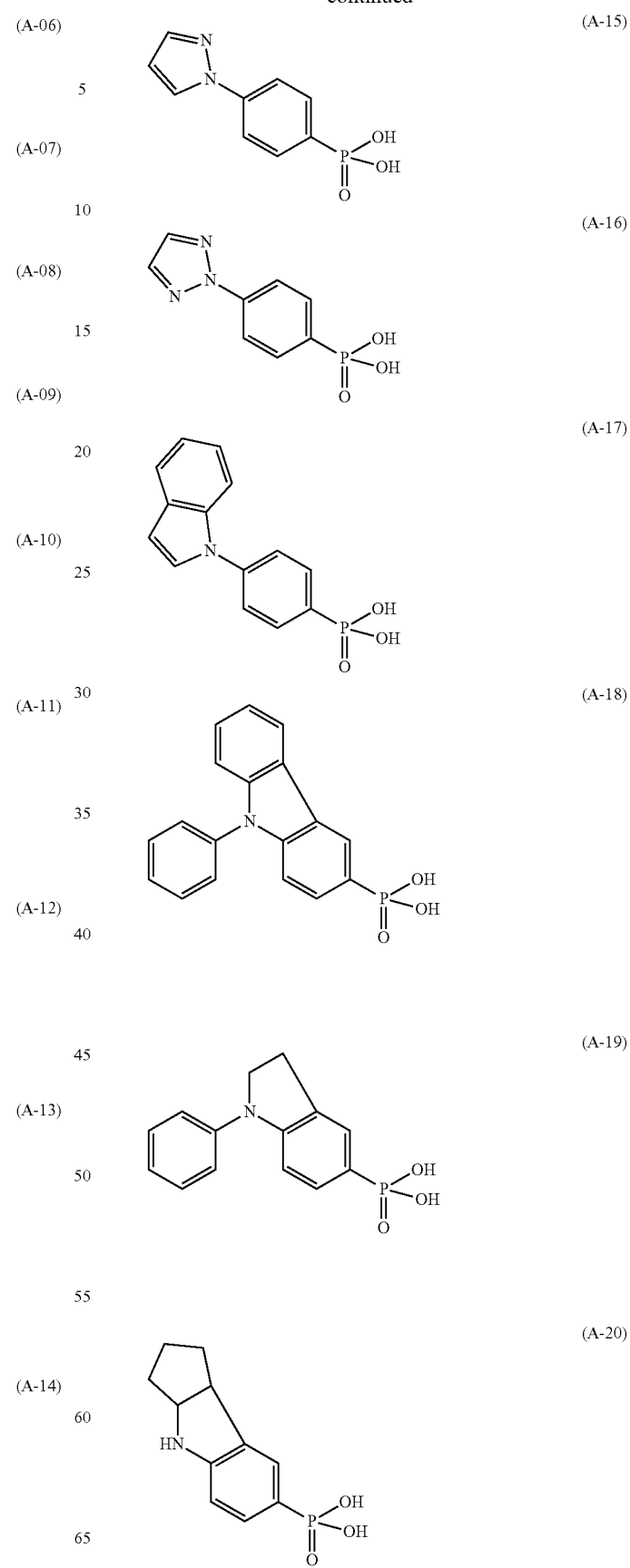

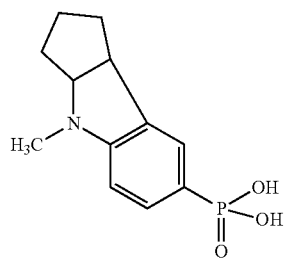 (A-21)
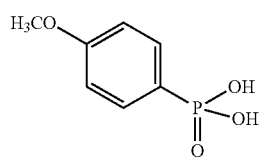 (A-22)
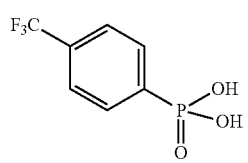 (A-23)
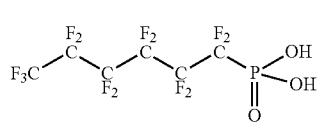 (A-24)
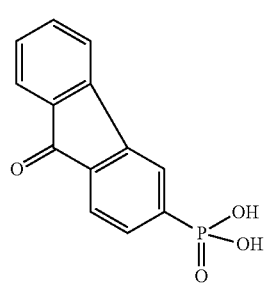 (A-25)
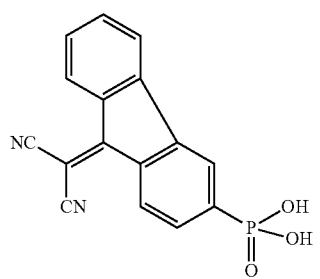 (A-26)
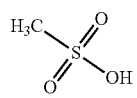 (A-27)
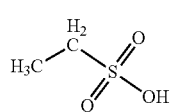 (A-28)
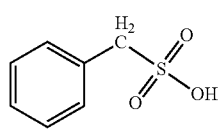 (A-29)
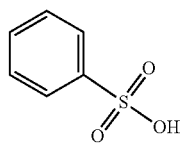 (A-30)
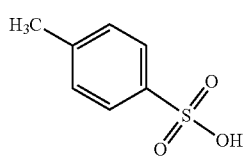 (A-31)
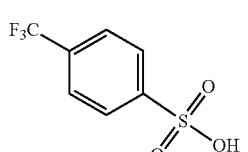 (A-32)
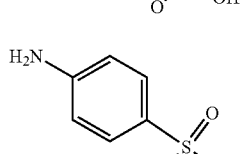 (A-33)
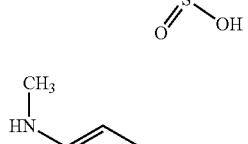 (A-34)
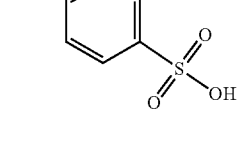 (A-35)
 (A-36)
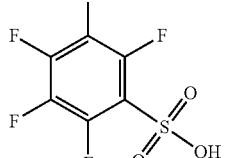
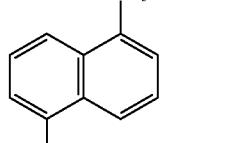 (A-37)
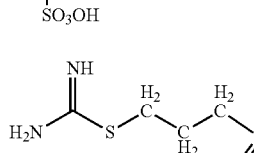 (A-38)

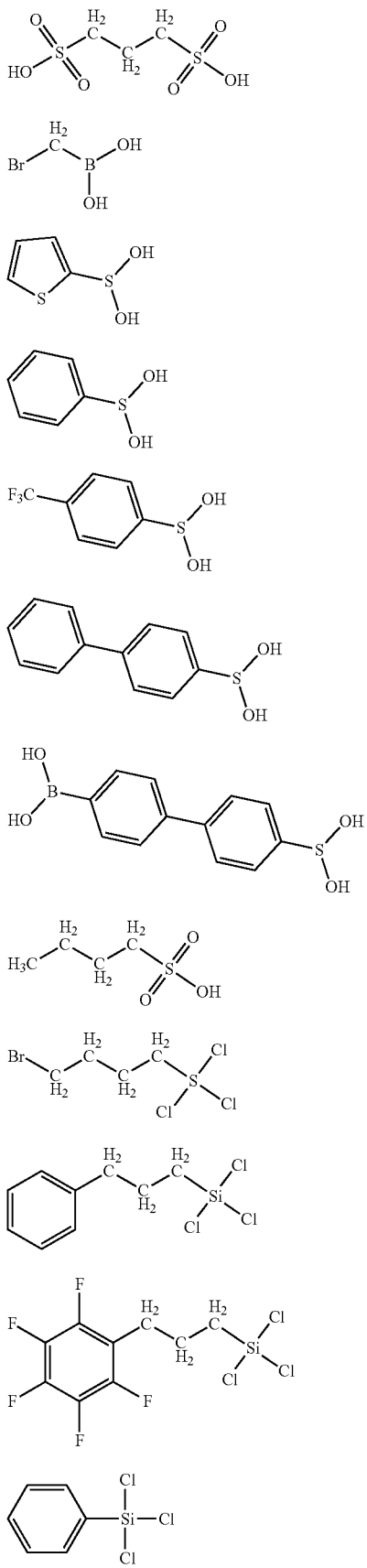
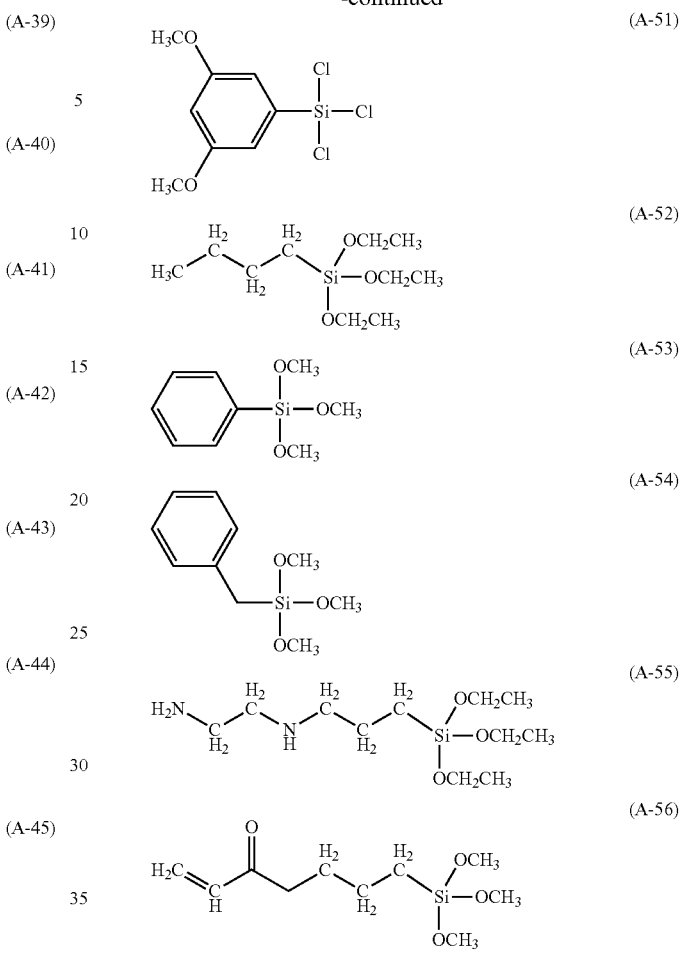

A thickness of the electron-transporting layer is not particularly limited and may be appropriately selected depending on the intended purpose. The thickness of the electron-transporting layer is preferably, for example, 5 nm or more but 1 micrometer or less, more preferably 10 nm or more but 700 nm or less.

The surface of the electron-transporting layer at the side of the photoelectric conversion layer is preferably as smooth as possible. A roughness factor, which is one indicator representing the smoothness, is preferably smaller. However, a roughness factor of the electron-transporting layer at the side of the photoelectric conversion layer is preferably 20 or less, more preferably 10 or less in terms of the relationship with an average thickness of the electron-transporting layer. The lower limit of the roughness factor is not particularly limited and may be appropriately selected depending on the intended purpose. The lower limit thereof is, for example, 1 or more.

The roughness factor is a rate of an actual surface area relative to an apparent surface area, and is also called the Wenzel's roughness factor. The actual surface area can be determined by measuring, for example, a BET specific surface area. Its value can be divided by an apparent surface area to obtain a roughness factor.

A method for producing a thin film of the electron-transporting material in the electron-transporting layer is not particularly limited and may be appropriately selected depending on the intended purpose. Examples of the method include: a method where a thin film of the electron-transporting material is formed in vacuum (vacuum film formation method); and a wet film formation method.

Examples of the vacuum film formation method include the sputtering method, the pulse laser deposition method (PLD method), the ion beam sputtering method, the ion assisted deposition method, the ion plating method, the vacuum deposition method, the atomic layer deposition method (ALD method), and the chemical vapor deposition method (CVD method).

Examples of the wet film formation method include a sol-gel method. The sol-gel method is the following method. Specifically, a solution is allowed to undergo a chemical reaction such as hydrolysis or polymerization•condensation to prepare gel. Then, it is subjected to a heat treatment to facilitate compactness. When the sol-gel method is used, a method for coating the sol solution is not particularly limited and may be appropriately selected depending on the intended purpose. Examples thereof include the dip method, the spray method, the wire bar method, the spin coating method, the roller coating method, the blade coating method, the gravure coating method, and wet printing methods such as relief printing, offset printing, gravure printing, intaglio printing, rubber plate printing, and screen printing. A temperature at which the heat treatment is performed after the sol solution is coated is preferably 80 degrees Celsius or more, more preferably 100 degrees Celsius or more.

A method for providing the compound on the electron-transporting material is not particularly limited and may be appropriately selected depending on the intended purpose. Examples of the method include a method where a solution containing the compound is coated on a thin film of the electron-transporting material, followed by drying.

The coating method is not particularly limited and may be appropriately selected depending on the intended purpose. Examples of the coating method include the dip method, the spray method, the wire bar method, spin coating method, the roller coating method, the blade coating method, and the gravure coating method.

A temperature at which a drying treatment is performed after coating of the solution is preferably 40 degrees Celsius or more, more preferably 50 degrees Celsius or more.

<Photoelectric Conversion Layer>

A photoelectric conversion layer is not particularly limited and may be appropriately selected depending on the intended purpose so long as it is a layer that performs photoelectric conversion. Examples of the photoelectric conversion layer include a perovskite layer and a bulk heterojunction layer.

<<Perovskite Layer>>

The perovskite layer means a layer that contains a perovskite compound and absorbs light to sensitize the electron-transporting layer. Therefore, the perovskite layer is preferably disposed adjacent to the electron-transporting layer.

A shape and size of the perovskite layer are not particularly limited and may be appropriately selected depending on the intended purpose.

The perovskite compound is a complex substance of an organic compound and an inorganic compound, and is represented by the following General Formula (4).

$$X_\alpha Y_\beta Z_\gamma \qquad \text{General Formula (4)}$$

In the General Formula (4), a ratio of $\alpha:\beta:\gamma$ is 3:1:1; $\beta$ and $\gamma$ are each an integer of more than 1; X represents a halogen atom; Y represents an organic compound including an amino group; and Z represents a metal ion.

X in the General Formula (4) is not particularly limited and may be appropriately selected depending on the intended purpose. Examples thereof include halogen atoms such as chlorine, bromine, and iodine. These may be used alone or in combination.

Example of Y in the above General Formula (4) include: organic cations such as ions of alkyl amine compounds (e.g., methyl amine, ethyl amine, n-butylamine, and formamidine); and inorganic alkali metal cations (e.g., a Sb atom, a Cs atom, a Rb atom, and a K atom). These may be used alone or in combination. The inorganic alkali metal cation and the organic cation may be each used in combination. Among them, an organic compound including an amino group is preferable.

In the case of the perovskite compound of lead halide and methylammonium, a peak $\lambda$max of the optical absorption spectrum is about 350 nm when the halogen ion is Cl, the peak $\lambda$max is about 410 nm when the halogen ion is Br, and the peak $\lambda$max is about 540 nm when the halogen ion is I. As described above, the peak $\lambda$max is shifted to a longer wavelength side, so a usable spectrum width (band width) varies.

Z in the above General Formula (4) is not particularly limited and may be appropriately selected depending on the intended purpose. Examples thereof include ions of metals such as lead, indium, antimony, tin, copper, and bismuth. These may be used alone or in combination.

The perovskite layer preferably has a stacked perovskite structure where a layer formed of metal halide and a layer of arranged organic cation molecules are alternatively stacked.

A method for forming the perovskite layer is not particularly limited and may be appropriately selected depending on the intended purpose. Examples of the method include a method in which a solution obtained by dissolving or dispersing, for example, metal halide and halogenated alkylamine or cesium halide is coated, followed by drying.

Moreover, examples of the method for forming the perovskite layer include a twostep precipitation method as described below. Specifically, a solution obtained by dissolving or dispersing metal halide is coated, followed by drying. Then, the resultant is immersed in a solution obtained by dissolving halogenated alkylamine, to form the perovskite compound.

Moreover, examples of the method for forming the perovskite layer include a method where a poor solvent (solvent having a small solubility) for the perovskite compound is added while a solution obtained by dissolving or dispersing, for example, metal halide and halogenated alkylamine is coated thereon, to precipitate crystals. In addition, examples of the method for forming the perovskite layer include a method for depositing metal halide in a gas filled with, for example, methylamine.

Among them, it is preferable to use a method where a poor solvent for the perovskite compound is added while a solution obtained by dissolving or dispersing, for example, metal halide and halogenated alkylamine is coated thereon, to precipitate crystals.

A method for coating the solution is not particularly limited and may be appropriately selected depending on the intended purpose. Examples of the method include the immersion method, the spin coating method, the spray method, the dip method, the roller method, and the air knife method. As the method for coating the solution, a method for performing precipitation in a supercritical fluid using, for example, carbon dioxide may be used.

Moreover, the perovskite layer may include a sensitizing dye.

A method for forming the perovskite layer including the sensitizing dye is not particularly limited and may be appropriately selected depending on the intended purpose. Examples of the method include: a method in which the perovskite compound and the sensitizing dye are mixed; and a method in which the perovskite layer is formed, followed by adsorbing the sensitizing dye.

The sensitizing dye is not particularly limited and may be appropriately selected depending on the intended purpose, so long as it is a compound photoexcited by excitation light to be used.

Examples of the sensitizing dye include metal complex compounds, coumarin compounds, polyene compounds, indoline compounds, thiophene compounds, cyanine dyes, merocyanine dyes, 9-aryl xanthene compounds, triarylmethane compounds, phthalocyanine compounds, and porphyrin compounds.

Examples of the metal complex compound include metal complex compounds described in, for example, Japanese Translation of PCT International Application Publication No. 7-500630, Japanese Unexamined Patent Application Publication No. 10-233238, Japanese Unexamined Patent Application Publication No. 2000-26487, Japanese Unexamined Patent Application Publication No. 2000-323191, and Japanese Unexamined Patent Application Publication No. 2001-59062.

Examples of the coumarin compound include coumarin compounds described in, for example, Japanese Unexamined Patent Application Publication No. 10-93118, Japanese Unexamined Patent Application Publication No. 2002-164089, Japanese Unexamined Patent Application Publication No. 2004-95450, and J. Phys. Chem. C, 7224, Vol. 111 (2007).

Examples of the polyene compound include polyene compounds described in, for example, Japanese Unexamined Patent Application Publication No. 2004-95450 and Chem. Commun., 4887 (2007).

Examples of the indoline compound include indoline compounds described in, for example, Japanese Unexamined Patent Application Publication No. 2003-264010, Japanese Unexamined Patent Application Publication No. 2004-63274, Japanese Unexamined Patent Application Publication No. 2004-115636, Japanese Unexamined Patent Application Publication No. 2004-200068, Japanese Unexamined Patent Application Publication No. 2004-235052, J. Am. Chem. Soc., 12218, Vol. 126 (2004), Chem. Commun., 3036 (2003), and Angew. Chem. Int. Ed., 1923, Vol. 47 (2008).

Examples of the thiophene compound include thiophene compounds described in, for example, J. Am. Chem. Soc., 16701, Vol. 128 (2006) and J. Am. Chem. Soc., 14256, Vol. 128 (2006).

Examples of the cyanine dye include cyanine dyes described in, for example, Japanese Unexamined Patent Application Publication No. 11-86916, Japanese Unexamined Patent Application Publication No. 11-214730, Japanese Unexamined Patent Application Publication No. 2000-106224, Japanese Unexamined Patent Application Publication No. 2001-76773, and Japanese Unexamined Patent Application Publication No. 2003-7359.

Examples of the merocyanine dye include merocyanine dyes described in, for example, Japanese Unexamined Patent Application Publication No. 11-214731, Japanese Unexamined Patent Application Publication No. 11-238905, Japanese Unexamined Patent Application Publication No. 2001-52766, Japanese Unexamined Patent Application Publication No. 2001-76775, and Japanese Unexamined Patent Application Publication No. 2003-7360.

Examples of the 9-aryl xanthene compound include 9-aryl xanthene compounds described in, for example, Japanese Unexamined Patent Application Publication No. 10-92477, Japanese Unexamined Patent Application Publication No. 11-273754, Japanese Unexamined Patent Application Publication No. 11-273755, and Japanese Unexamined Patent Application Publication No. 2003-31273.

Examples of the triarylmethane compound include triarylmethane compounds described in, for example, Japanese Unexamined Patent Application Publication No. 10-93118 and Japanese Unexamined Patent Application Publication No. 2003-31273. Examples of the phthalocyanine compound and the porphyrin compound include phthalocyanine compounds and porphyrin compounds described in, for example, Japanese Unexamined Patent Application Publication No. 9-199744, Japanese Unexamined Patent Application Publication No. 10-233238, Japanese Unexamined Patent Application Publication No. 11-204821, Japanese Unexamined Patent Application Publication No. 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230, Vol. 3 (1999), Angew. Chem. Int. Ed., 373, Vol. 46 (2007), and Langmuir, 5436, Vol. 24 (2008).

Among them, metal complex compounds, indoline compounds, thiophene compounds, and porphyrin compounds are preferable.

<<Bulk Heterojunction Layer>>

The bulk heterojunction layer includes an electron-donating organic material and an electron-withdrawing organic material.

In the bulk heterojunction layer, an electron-donating organic material (P-type organic semiconductor) and an electron-withdrawing organic material (N-type organic semiconductor) are mixed, and thus the bulk heterojunction, which is the nano-sized PN junction, will occur. As a result, photocharge separation occurring at the junction surface can be used to obtain electric current.

<<<Electron-Donating Organic Material (P-Type Organic Semiconductor)>>>

Examples of the P-type organic semiconductor include conjugated polymers and low-molecular-weight compounds such as polythiophene or derivatives thereof, arylamine derivatives, stilbene derivatives, oligothiophene or derivatives thereof, phthalocyanine derivatives, porphyrin or derivatives thereof, polyphenylene vinylene or derivatives thereof, polythienylene vinylene or derivatives thereof, benzodithiophene derivatives, and diketo-pyrrolo-pyrrole derivatives. These may be used alone or in combination.

Among them, polythiophene or derivatives thereof, which are π-conjugated conductive polymers, are preferable. The olythiophene and derivatives thereof are advantageous because they can ensure an excellent stereoregularity and have a relatively high solubility to a solvent.

The polythiophene and the derivatives thereof are not particularly limited and may be appropriately selected depending on the intended purpose, so long as they have a thiophene skeleton. Examples thereof include: polyalkylthiophene such as poly-3-hexylthiophene; polyalkylisothionaphthene such as poly-3-hexylisothionaphthene, poly-3-octylisothionaphthene, and poly-3-decylisothionaphthene; and polyethylenedioxythiophene.

In recent years, derivatives such as PTB7 (poly[{4,8-bis[(2-ethylhexyl)oxy]benzo[1,2-b:4,5-b']dithiophene-2,6-diyl}{3-fluoro-2-[(2-ethylhexyl)carbonyl]thieno[3,4-b]thiophenediyl}]) and PCDTBT (Poly[N-9"-heptadecanyl-2,7-carbazole-alt-5,5-(4',7'-di-2-thienyl-2',1',3'-benzothiadiazole])), which are copolymers including benzodithiophene, carbazole, benzothiadiazole, and thiophene, have been exemplified as a compound that can achieve an excellent photoelectric conversion efficiency.

In addition to the conjugated polymers, even in the low-molecular-weight compounds obtained by binding an electron-donating unit with an electron-withdrawing unit, compounds that can achieve an excellent photoelectric conversion efficiency have been known and can also be used in the present disclosure (see, for example, ACSAppl. Mater. Interfaces 2014, 6, 803-810).

Among the low-molecular-weight compounds as the electron-donating organic material, a compound represented by the following General Formula (A) is preferable.

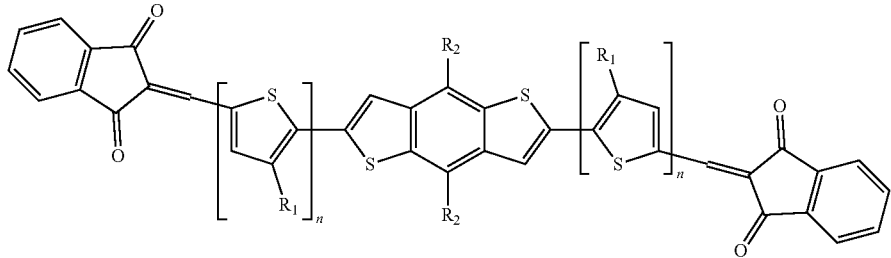

General Formula (A)

In the General Formula (A), n represents an integer of from 1 through 3.

$R_1$ represents an n-butyl group, an n-hexyl group, an n-octyl group, an n-decyl group, or an n-dodecyl group.

$R_2$ represents an oxygen atom having an alkyl group having from 6 through 22 carbon atoms, a sulfur atom having an alkyl group having from 6 through 22 carbon atoms, a carbon atom having an alkyl group having from 6 through 22 carbon atoms, or a group represented by the following General Formula (B). Among them, an oxygen atom having an alkyl group having from 6 through 20 carbon atoms, a sulfur atom having an alkyl group having from 6 through 20 carbon atoms, a carbon atom having an alkyl group having from 6 through 20 carbon atoms, and a group represented by the following General Formula (B) are preferable.

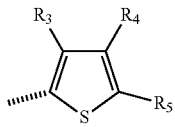

General Formula (B)

In the General Formula (B), $R_3$ and $R_4$ represent a hydrogen atom or an alkyl group having from 6 through 12 carbon atoms.

$R_5$ represents an alkyl group that includes from 6 through 22 carbon atoms and may be branched. Among them, an alkyl group that includes from 6 through 12 carbon atoms and may be branched is preferable.

As the electron-donating organic material, specific examples of the low-molecular-weight compound are preferably compounds represented by the following General Formula (C).

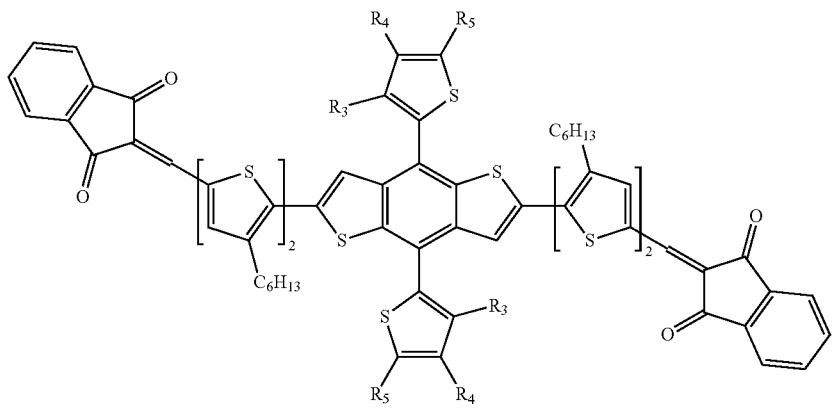

General Formula (C)

In the General Formula (C), $R_3$ and $R_4$ represent a hydrogen atom or an alkyl group having from 6 through 12 carbon atoms, preferably represent a hydrogen atom or an alkyl group having from 6 through 10 carbon atoms.

$R_5$ represents an alkyl group that has from 6 through 22 carbon atoms and may be branched, preferably represents an alkyl group that has from 6 through 12 carbon atoms and may be branched.

Specific examples of the compound represented by the General Formula (C) will be described below. However, the present disclosure is not limited thereto.

TABLE 1

| Exemplified compounds | $R_3$ | $R_4$ | $R_5$ |
|---|---|---|---|
| 1 | H | H | 2-ethylhexyl |
| 2 | H | n-hexyl | n-hexyl |
| 3 | H | H | n-hexyl |
| 4 | n-hexyl | H | n-hexyl |
| 5 | H | H | 2-butyloctyl |
| 6 | H | n-octyl | n-octyl |
| 7 | H | H | n-octyl |
| 8 | n-octyl | H | n-octyl |
| 9 | H | H | 2-decyldodecyl |
| 10 | H | n-dodecyl | n-dodecyl |
| 11 | H | H | n-dodecyl |
| 12 | n-dodecyl | H | n-dodecyl |

<<Electron-Withdrawing Organic Material (N-Type Organic Semiconductor)>>

Examples of the electron-withdrawing organic material include imide derivatives, fullerene, and fullerene derivatives. Among them, fullerene derivatives are preferable in terms of charge separation and charge transport.

As the fullerene derivative, an appropriately synthesized product may be used or a commercially available product may be used. Examples of the fullerene derivative include PC71BM (phenyl C71 butyric acid methyl ester, available from Frontier Carbon Corporation), PC61BM (phenyl C61 butyric acid methyl ester, available from Frontier Carbon Corporation), PC85BM (phenyl C85 butyric acid methyl ester, available from Frontier Carbon Corporation), and ICBA (fullerene indene 2 adduct, available from Frontier Carbon Corporation). In addition to the above, fulleropyrrolidine-based fullerene derivatives represented by the following General Formula (D) may be used.

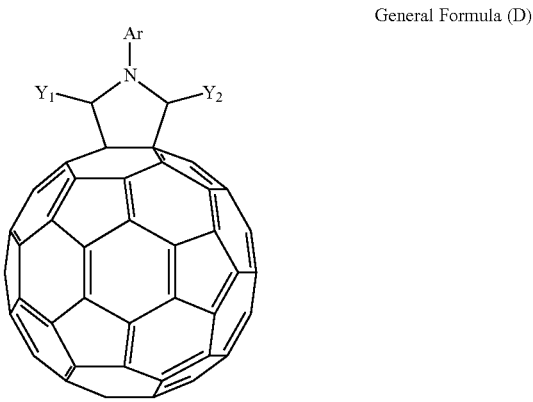

General Formula (D)

In the General Formula (D), $Y_1$ and $Y_2$, which may be identical to or different from each other, represent a hydrogen atom, an alkyl group that may have a substituent, an alkenyl group that may have a substituent, an alkynyl group that may have a substituent, an aryl group that may have a substituent, or an aralkyl group that may have a substituent.

Note that, $Y_1$ and $Y_2$ are not a hydrogen atom at the same time.

Ar represents an aryl group that may have a substituent.

Specific examples of the aryl group include a phenyl group, a naphthyl group, an anthryl group, and a phenanthryl group. Among them, a phenyl group is preferable.

When Ar represents the aryl group that has a substituent, the substituent preferably excludes an oxygen atom. Examples of the substituent include an aryl group, an alkyl group, a cyano group, an alkoxy group, and an alkoxycarbonyl group.

Among these substituents, examples of the aryl group include a phenyl group.

The alkyl group and the alkyl group portion of the alkoxy group are, for example, an alkyl group having from 1 through 22 carbon atoms similarly to alkyl groups represented by $Y_1$ and $Y_2$ that will be described below.

The number and substitution site of these substituents are not particularly limited. For example, one to three substituent(s) can exist at any position of the aryl group represented by Ar.

Among the groups represented by $Y_1$ and $Y_2$, the alkyl group is preferably an alkyl group having from 1 through 22 carbon atoms, more preferably an alkyl group having from 1 through 12 carbon atoms, particularly preferably an alkyl group having from 6 through 12 carbon atoms. These alkyl groups may be a straight-chain alkyl group or may be a branched alkyl group, but are particularly preferably a straight-chain alkyl group.

The alkyl group may further include one or two or more hetero elements such as S and O in the carbon chain thereof.

Among the groups represented by $Y_1$ and $Y_2$, the alkenyl group is preferably an alkenyl group having from 2 through 10 carbon atoms. Particularly preferable specific examples thereof include straight-chain or branched alkenyl groups having from 2 through 4 carbon atoms such as a vinyl group, a 1-propenyl group, an aryl group, an isopropenyl group, a 1-butenyl group, a 2-butenyl group, a 3-butenyl group, a 1-methyl-2-propenyl group, and a 1,3-butadienyl group.

Among the groups represented by $Y_1$ and $Y_2$, the alkynyl group is preferably an alkynyl group having from 1 through 10 carbon atoms. Particularly preferable specific examples thereof include straight-chain or branched alkynyl groups having from 2 through 4 carbon atoms such as an ethynyl group, a 1-propynyl group, a 2-propynyl group, a 1-methyl-2-propynyl group, a 1-butynyl group, a 2-butynyl group, and a 3-butynyl group.

Among the groups represented by $Y_1$ and $Y_2$, examples of the aryl group include a phenyl group, a naphthyl group, an anthryl group, and a phenanthryl group.

Among the groups represented by $Y_1$ and $Y_2$, examples of the aralkyl group include aralkyl groups having from 7 through 20 carbon atoms such as 2-phenylethyl, benzyl, 1-phenylethyl, 3-phenylpropyl, and 4-phenylbutyl.

As described above, the alkyl group, the alkenyl group, the alkynyl group, the aryl group, and the aralkyl group of the groups represented by $Y_1$ and $Y_2$ include a case of including a substituent or a case of including no substituent.

Examples of the substituent that can be included in the groups represented by $Y_1$ and $Y_2$ include an alkyl group, an alkoxycarbonyl group, a polyether group, an alkanoyl group, an amino group, an aminocarbonyl group, an alkoxy group, an alkylthio group, a group: —CONHCOR' (wherein R' is an alkyl group), a group: —C(=NR')—R" (wherein R' and R" are an alkyl group), and a group: —NR'=CR"R'" (wherein R', R", and R'" are an alkyl group).

Among these substituents, examples of the polyether group include a group represented by the formula: $Y_3$—$(OY_4)$n—O—. Here, $Y_3$ represents a monovalent hydrocarbon group such as an alkyl group, and $Y_4$ represents a bivalent aliphatic hydrocarbon group.

In the polyether group represented by the above formula, specific examples of a recurring unit represented by —$(OY_4)_n$— include alkoxy chains such as —$(OCH_2)_n$—, —$(OC_2H_4)_n$—, and —$(OC_3H_6)_n$—. The recurring number n of these recurring units is preferably from 1 through 20, more preferably from 1 through 5. The recurring unit represented by —$(OY_4)_n$— may include not only the same recurring unit but also two or more kinds of different recurring units. Among the aforementioned recurring units, —$OC_2H_4$— and —$OC_3H_6$— may have a straight chain or a branched chain.

Among the substituents, the alkyl group, and the alkyl group portion (R', R") in the alkoxycarbonyl group, the alkanoyl group, the alkoxy group, the alkylthio group, the polyether group, the group: —CONHCOR', the group: —C(=NR')—R", and the group: —NR'=CR"R'" are preferably an alkyl group having from 1 through 22 carbon atoms, more preferably an alkyl group having from 1 through 12 carbon atoms, particularly preferably an alkyl group having from 6 through 12 carbon atoms, similarly to the aforementioned alkyl group.

The amino group, and the amino group portion in the aminocarbonyl group are particularly preferably an amino group to which one or more alkyl groups having from 1 through 20 carbon atoms are bound.

Among the fullerene derivatives represented by the General Formula (D), examples of the compound having preferable performances include compounds represented by the General Formula (D), where Ar represents a substituent or a phenyl group that has no substituent; and one of $Y_1$ and $Y_2$ is a hydrogen atom, and the other is an alkyl group including an alkoxycarbonyl group as a substituent, an alkyl group including an alkoxy group as a substituent, an alkyl group including a polyether group as a substituent, an alkyl group including an amino group as a substituent, or a phenyl group that includes a substituent or includes no substituent.

Among these compounds, examples of the compound having particularly preferable performances include compounds represented by the General Formula (D), where Ar includes, as a substituent, a phenyl group, a cyano group, an alkoxy group, an alkoxycarbonyl group, or an alkyl group, or represents a phenyl group that includes no substituent; one of $Y_1$ and $Y_2$ is a hydrogen atom, and the other represents an alkyl group including an alkoxycarbonyl group as a substituent, an alkyl group including an alkoxy group as a substituent, an alkyl group including a polyether group as a substituent, a phenyl group, a phenyl group including an alkyl group as a substituent, a phenyl group including an alkoxycarbonyl group as a substituent, or a phenyl group including an alkoxy group as a substituent.

These compounds include a group having an appropriate polarity on the pyrrolidine skeleton and are excellent in a self-assembling property. Therefore, when a photoelectric conversion layer having a bulk heterojunction structure is formed, it is possible to form a photoelectric conversion part that has a bulk heterojunction structure having an appropriate layer separation structure. As a result, it is believed that, for example, the electron mobility is improved to exhibit a high conversion efficiency.

Examples of the most preferable compound include compounds represented by the General Formula (D), where Ar represents a phenyl group; one of $Y_1$ and $Y_2$ represents a hydrogen atom, and the other represents a non-substituted alkyl group (alkyl group having from 4 through 6 carbon atoms), a non-substituted phenyl group, a 1-naphthyl group, or a 2-naphthyl group.

A method for forming the bulk heterojunction layer is not particularly limited and may be appropriately selected depending on the intended purpose. Examples of the method include the spin coating, the blade coating, the slit die coating, the screen printing coating, the bar coater coating, the mold coating, the transfer printing method, the dip drawing method, the inkjet method, the spray method, and the vacuum deposition method. The coating method can be appropriately selected from these coating methods depending on the characteristics (e.g., thickness control and orientation control) of the thin film of the organic material to be produced.

For example, when the spin coating is performed, the P-type organic semiconductor and the N-type organic semiconductor preferably have a concentration of 5 mg/mL or more but 40 mg/mL or less. This concentration makes it possible to easily produce a thin film of a uniform organic material.

In order to remove an organic solvent from the produced thin film of the organic material, an annealing treatment may be performed under reduced pressure or under an inert atmosphere (under nitrogen or argon atmosphere). The temperature of the annealing treatment is preferably 40 degrees Celsius or more but 300 degrees Celsius or less, more preferably 50 degrees Celsius or more but 200 degrees Celsius or less. The annealing treatment can increase an effective area where stacked layers permeate at the boundary to contact each other. Therefore, the short circuit current can be increased. Note that, the annealing treatment may be performed after formation of electrodes.

The organic solvent is not particularly limited and may be appropriately selected depending on the intended purpose. Examples of the solvent include methanol, ethanol, butanol, toluene, xylene, o-chlorophenol, acetone, ethyl acetate, ethylene glycol, tetrahydrofuran, dichloromethane, chloroform, dichloroethane, chlorobenzene, dichlorobenzene, trichlorobenzene, chloronaphthalene, dimethylformamide, dimethyl sulfoxide, N-methylpyrrolidone, and γ-butyrolactone. These may be used alone or in combination. Among them, chlorobenzene, chloroform, and o-dichlorobenzene are preferable.

In order to control the phase separation structure of the P-type organic semiconductor and the N-type organic semiconductor, an additive may be added to the organic solvent in an amount of 0.1% by mass or more but 10% by mass or less. Examples of the additive include iodoalkanes (e.g., 1,8-diiodooctane, 1,6-diiodohexane, and 1,10-diiododecane), alkane dithiols (e.g., 1,8-octanedithiol, 1,6-hexanedithiol, and 1,10-decanedithiol), 1-chloronaphthalene, and polydimethylsiloxane derivatives.

An average thickness of the photoelectric conversion layer is preferably 50 nm or more but 400 nm or less, more preferably 60 nm or more but 250 nm or less. When the average thickness is 50 nm or more, insufficient generation of carriers, which is caused by decreasing light absorption in the photoelectric conversion layer, does not occur. When the average thickness is 400 nm or less, the transport efficiency of carriers generated by light absorption is not further decreased.

<Organic Salt and Inorganic Salt>

The photoelectric conversion element preferably includes at least one salt selected from the group consisting of an organic salt and an inorganic salt between the photoelectric conversion layer and the hole-transporting layer.

When the photoelectric conversion element includes the salt between the photoelectric conversion layer and the hole-transporting layer, it can be expected that the physical characteristics of the boundary are controlled.

When the photoelectric conversion layer is a perovskite layer, the salt is preferably a salt different from the salt constituting the perovskite layer.

The salt is not particularly limited and may be appropriately selected depending on the intended purpose. Particularly, when the perovskite compound is used in the photoelectric conversion layer, the cation preferably includes a halogen atom in terms of compatibility. Examples of the halogen atom include chlorine, iodine, and bromine.

Particularly, when the perovskite compound is used in the photoelectric conversion layer, the organic salt is preferably a halogenated hydroacid salt of amine in terms of compatibility.

Particularly, when the perovskite compound is used in the photoelectric conversion layer, the inorganic salt is preferably a halide of an alkali metal in terms of compatibility. Examples of the alkali metal include lithium, sodium, potassium, rubidium, and cesium.

Examples of the halogenated hydroacid salt of amine include n-butylamine hydrobromide, n-butylamine hydroiodide, n-hexylamine hydrobromide, n-hexylamine hydroiodide, n-decylamine hydrobromide, n-octadecylamine hydroiodide, pyridine hydrobromide, aniline hydroiodide, hydrazine dihydrobromide, ethylenediamine dihydroiodide, 2-phenylethylamine hydroiodide, phenylenediamine dihydrochloride, diphenylamine hydrobromide, diphenylamine hydroiodide, benzylamine hydroiodide, and 4-diphenylamino phenethylamine hydroiodide.

Examples of the halide of the alkali metal include cesium iodide, cesium bromide, rubidium iodide, and potassium iodide.

A method for providing at least one salt selected from the group consisting of an organic salt and an inorganic salt between the photoelectric conversion layer and the hole-transporting layer is not particularly limited and may be appropriately selected depending on the intended purpose. One example of the method is, for example, a method where a solution containing the salt is coated on the photoelectric conversion layer, followed by drying, and then a hole-transporting layer is formed thereon. Examples of the solution include an aqueous solution and an alcohol solution. The coating method is not particularly limited and may be appropriately selected depending on the intended purpose. Examples of the coating method include the dip method, the spray method, the wire bar method, spin coating method, the roller coating method, the blade coating method, and the gravure coating method.

The temperature at when the drying treatment is performed after coating of the solution is not particularly limited and may be appropriately selected depending on the intended purpose.

It is not necessary to uniformly distribute the organic salt and the inorganic salt at the boundary between the perovskite layer and the hole-transporting layer. For example, the organic salt and the inorganic salt may exist locally at a plurality of regions (e.g., in the form of an island). The perovskite compound of the perovskite layer may react with the hole-transporting material of the hole-transporting layer, to distribute the organic salt and the inorganic salt in the perovskite layer or the hole-transporting layer. That is, such a region that the organic salt and the inorganic salt exist may be included between the perovskite layer where neither the organic salt nor the inorganic salt exists and the hole-transporting layer where neither the organic salt nor the inorganic salt exists.

<Hole-Transporting Layer>

The hole-transporting layer means a layer that transports holes generated in the photoelectric conversion layer to a second electrode that will be described hereinafter. Therefore, the hole-transporting layer is preferably disposed adjacent to the photoelectric conversion layer directly or via the salt.

The hole-transporting layer includes, for example, a solid hole-transporting material and if necessary includes other materials.

The solid hole-transporting material (hereinafter may be referred to simply as "hole-transporting material") is not particularly limited and may be appropriately selected depending on the intended purpose so long as it is a material having such properties that can transport holes. The hole-transporting layer preferably an organic compound.

When an organic compound is used as the hole-transporting material, for example, the hole-transporting layer includes two or more kinds of compounds.

Examples of the organic compound include polymer materials.

The polymer materials used in the hole-transporting layer are not particularly limited and may be appropriately selected depending on the intended purpose. Examples thereof include polythiophene compounds, polyphenylene vinylene compounds, polyfluorene compounds, polyphenylene compounds, polyarylamine compounds, and polythiadiazole compounds.

Examples of the polythiophene compound include poly(3-n-hexylthiophene), poly(3-n-octyloxythiophene), poly(9,9'-dioctyl-fluorene-co-bithiophene), poly(3,3'''-didodecyl-quarter thiophene), poly(3,6-dioctylthieno[3,2-b]thiophene), poly(2,5-bis(3-decylthiophen-2-yl)thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene).

Examples of the polyphenylene vinylene compound include poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylhexyloxy)-1,4-phenylenevinylene)-co-(4,4'-biphenylenevinylene)].

Examples of the polyfluorene compound include poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)].

Examples of the polyphenylene compound include poly[2,5-dioctyloxy-1,4-phenylene] and poly[2,5-di(2-ethylhexyloxy-1,4-phenylene].

Examples of the polyarylamine compound include poly[(9,9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly[(N,N'-bis(4-octyloxyphenyl)benzidine-N,N'-(1,4-diphenylene)], poly[(N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinyl ene-1,4-phenylene], and poly[4-(2-ethylhexyloxy)phenylimino-1,4-biphenylene].

Examples of the polythiadiazole compound include poly[(9,9-dioctylfluorenyl-2,7-diyl)-alt-co-(1,4-benzo(2,1',3) thiadiazole] and poly(3,4-didecylthiophene-co-(1,4-benzo(2,1',3)thiadiazole).

Among them, in terms of carrier mobility and ionization potential, polythiophene compounds and polyarylamine compounds are preferable, and a polymer including a recurring unit represented by General Formula (1) below is further preferable.

In the present disclosure, the hole-transporting layer includes a polymer including a recurring unit represented by General Formula (1) below and a compound represented by General Formula (2) below. This makes it possible to decrease the resistance of the hole-transporting layer.

General Formula (1)

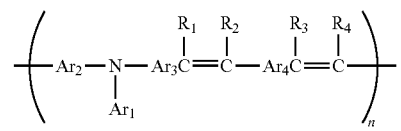

In the General Formula (1), $Ar_1$ represents an aromatic hydrocarbon group, and the aromatic hydrocarbon group may be substituted with a substituent; $Ar_2$ and $Ar_3$ each independently represent a bivalent group of a monocyclic aromatic hydrocarbon group, a non-condensed polycyclic aromatic hydrocarbon group, or a condensed polycyclic aromatic hydrocarbon group, which may be substituted with a substituent; $Ar_4$ represents a bivalent group of benzene, thiophene, biphenyl, anthracene, or naphthalene, which may be substituted with a substituent; $R_1$ to $R_4$ each independently represent a hydrogen atom, an alkyl group, or an aryl group; and n represents an integer that is 2 or more and allows the polymer represented by the General Formula (1) to have a weight average molecular weight of 2,000 or more.

General Formula (2)

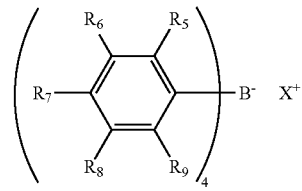

In the General Formula (2), $R_5$ to $R_9$, which may be identical to or different from each other, represent a hydrogen atom, a halogen atom, an alkyl group, an alkoxy group, or an aryl group; and X represents a cation.

$Ar_1$ in the General Formula (1) is an aromatic hydrocarbon group, and one example of the aromatic hydrocarbon group is, for example, an aryl group. Examples of the aryl group include a phenyl group, a 1-naphthyl group, and a 9-anthracenyl group. The aryl group may have a substituent. Examples of the substituent include an alkyl group, an alkoxy group, and an aryl group.

$Ar_2$ and $Ar_3$ each independently represent a bivalent group of a monocyclic aromatic hydrocarbon group, a non-condensed polycyclic aromatic hydrocarbon group, or a condensed polycyclic aromatic hydrocarbon group. Examples thereof include an arylene group and a bivalent heterocyclic group. Examples of the arylene group include 1,4-phenylene, 1,1'-biphenylene, and 9,9'-di-n-hexylfluorene. Examples of the bivalent heterocyclic group include 2,5-thiophene. The aryl group may have a substituent. Examples of the substituent include an alkyl group, an alkoxy group, and an aryl group.

$Ar_4$ represents a bivalent group of benzene, thiophene, biphenyl, anthracene, or naphthalene, which may be substituted with a substituent. Examples of the substituent include an alkyl group, an alkoxy group, and an aryl group.

$R_1$ to $R_4$ each independently represent, for example, a hydrogen atom, an alkyl group, or an aryl group. Examples of the alkyl group include a methyl group and an ethyl group. Examples of the aryl group include a phenyl group and a 2-naphthyl group. The alkyl group and the aryl group may have a substituent.

A weight average molecular weight of the polymer including the recurring unit represented by the General Formula (1) is preferably 2,000 or more but 100,000 or less.

The weight average molecular weight can be measured through gel permeation chromatography (GPC).

Specific examples of the polymer including the recurring unit represented by the General Formula (1) include, but are not limited to, the following (A-01) to (A-20). In the formulas, n represents an integer that is 2 or more and allows the polymer including the recurring unit represented by the General Formula (1) to have a weight average molecular weight of 2,000 or more.

Examples of the substituent of both terminals of the respective polymers include a hydrogen atom, an alkyl group, and an aryl group.

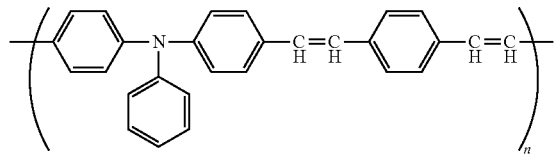
(A-01)

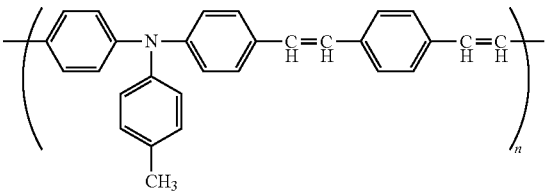
(A-02)

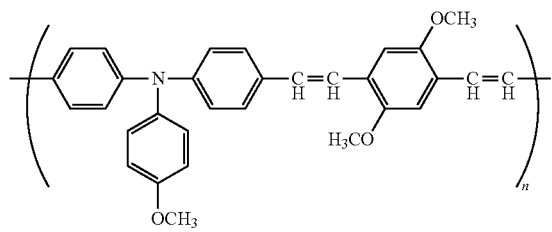
(A-03)

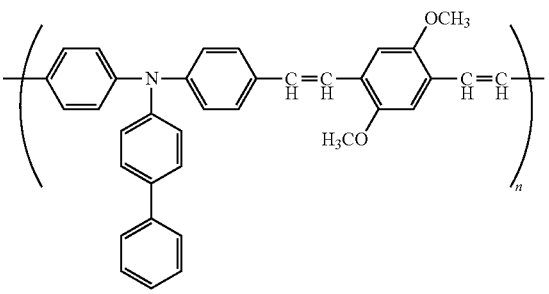
(A-04)

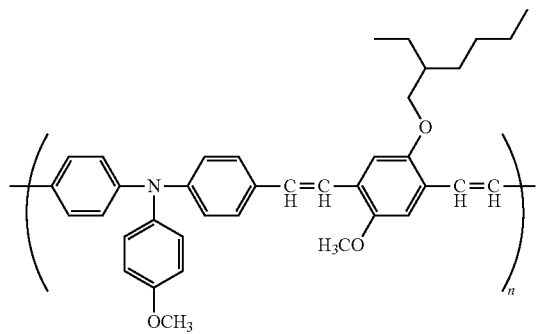
(A-05)

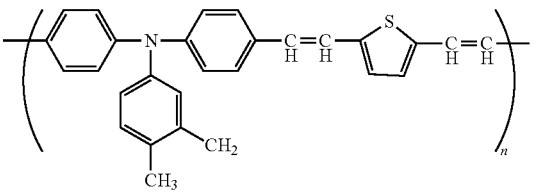
(A-06)

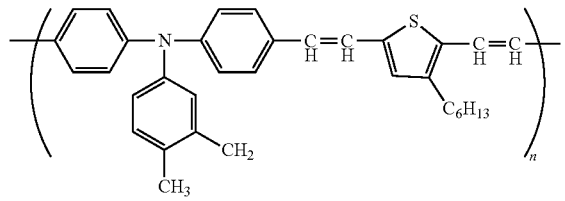
(A-07)

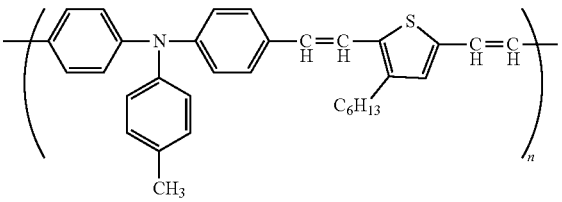
(A-08)

-continued
(A-09)
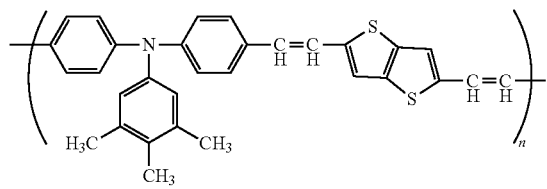
(A-10)
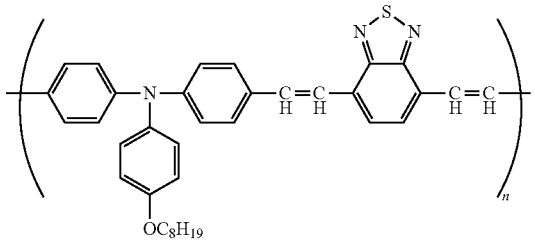
(A-11)
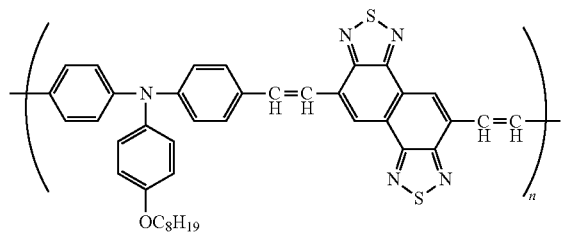
(A-12)
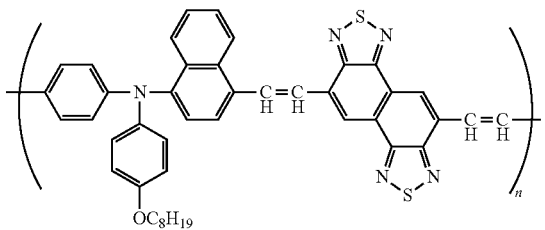
(A-13)
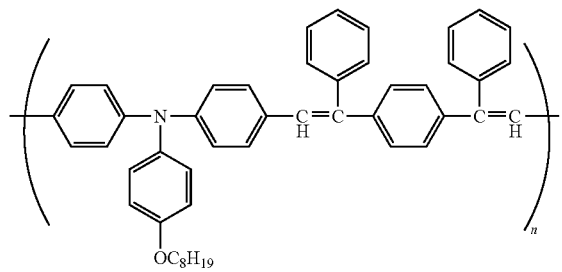
(A-14)
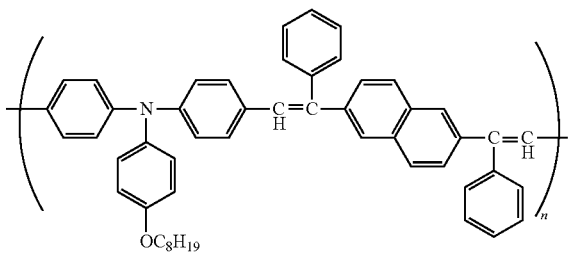
(A-15)
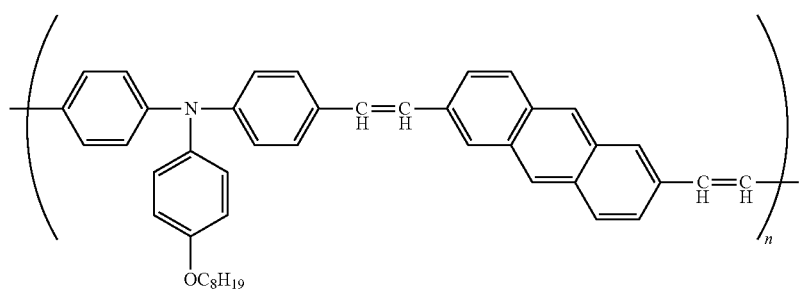
(A-16)
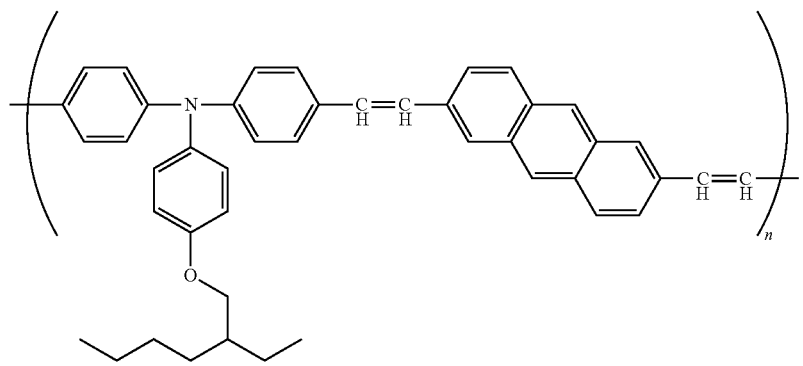

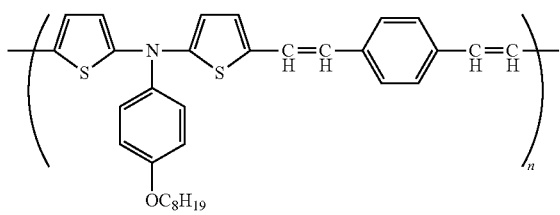 (A-17)

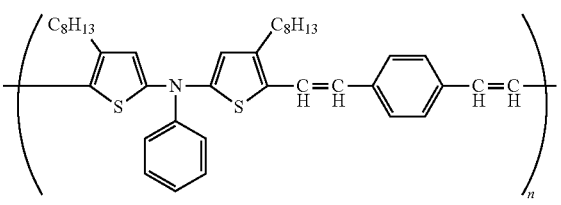 (A-18)

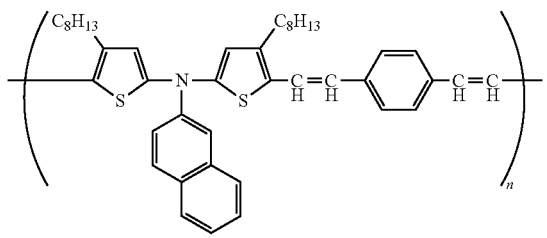 (A-19)

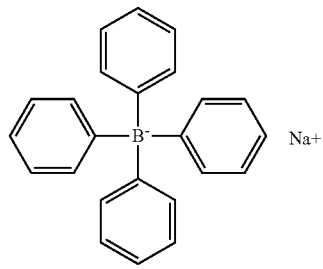 (A-20)

In the General Formula (2), $R_5$ to $R_9$, which may be identical to or different from each other, represent a hydrogen atom, a halogen atom, an alkyl group, an alkoxy group, or an aryl group; X represents a cation; and $R_1$ and $R_2$ or $R_2$ and $R_3$ may be joined together to form a ring structure.

Examples of the halogen atom include a chlorine atom, a bromine atom, and an iodine atom.

Examples of the alkyl group include an alkyl group having from 1 through 6 carbon atoms. The alkyl group may be substituted with a halogen atom.

Examples of the alkoxy group include an alkoxy group having from 1 through 6 carbon atoms.

Examples of the aryl group include a phenyl group.

The cation is not particularly limited and may be appropriately selected depending on the intended purpose. Examples of the cation include an alkali metal cation, a phosphonium cation, an iodonium cation, a nitrogen containing cation, and a sulfonium cation. The nitrogen containing cation means an ion including a positive charge on a nitrogen atom. Examples of the nitrogen containing cation include an ammonium cation, a pyridinium cation, and an imidazolium cation.

Specific examples of the compound represented by the General Formula (2) include, but are not limited to, the following (B-01) to (B-28).

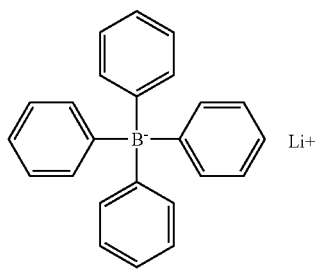 (B-01)

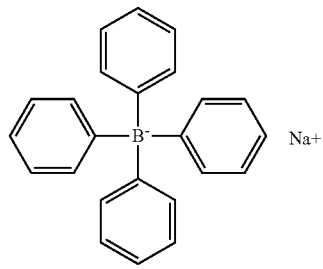 (B-02)

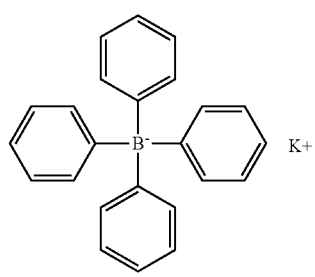 (B-03)

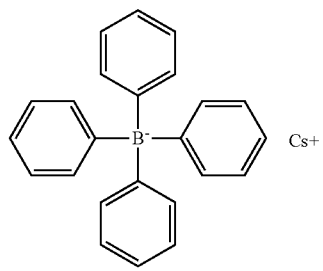 (B-04)

(B-05)
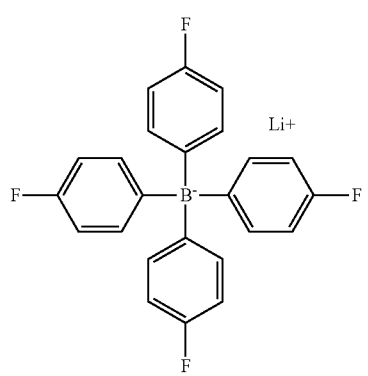
(B-06)
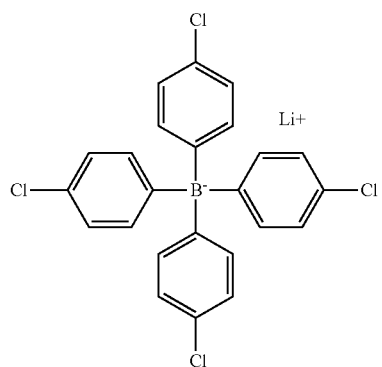
(B-07)
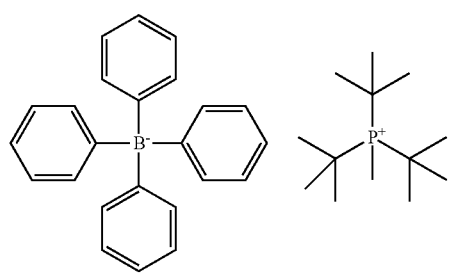
(B-08)
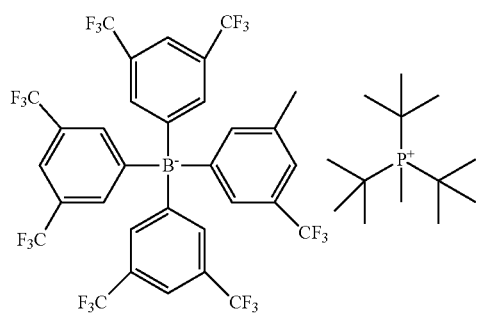
(B-09)
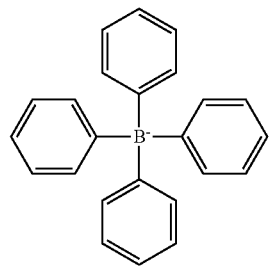
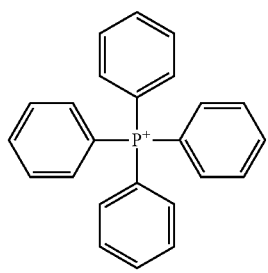
(B-10)
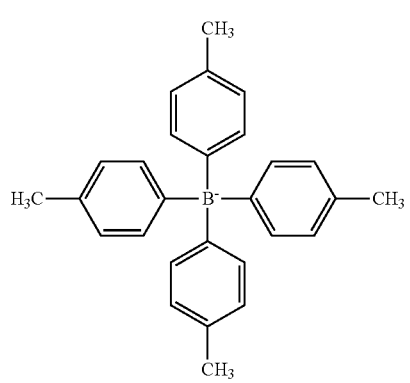
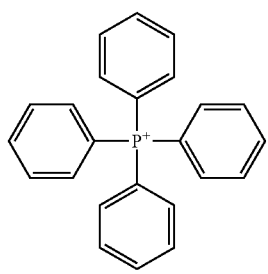

(B-11)
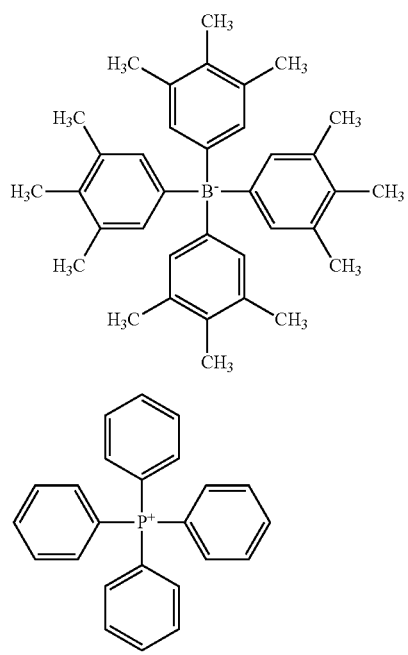
(B-12)
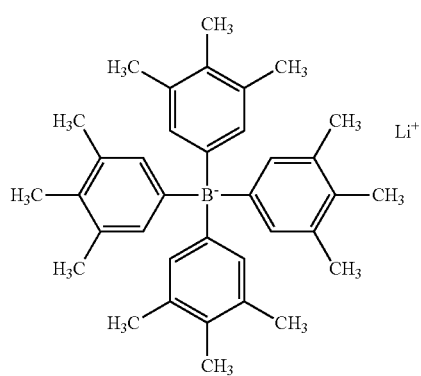
(B-13)
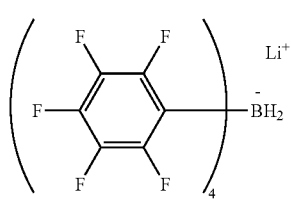
(B-14)
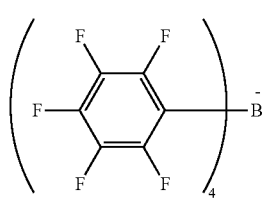
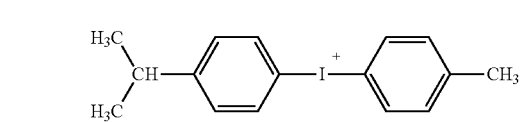
(B-15)
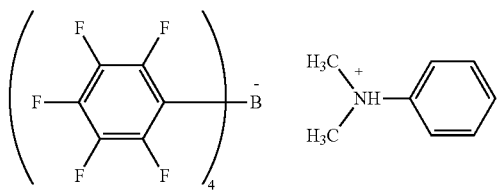
(B-16)
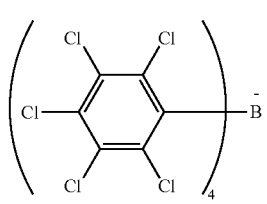
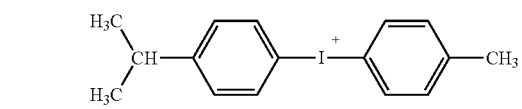
(B-17)
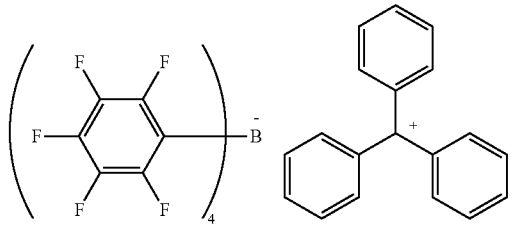
(B-18)
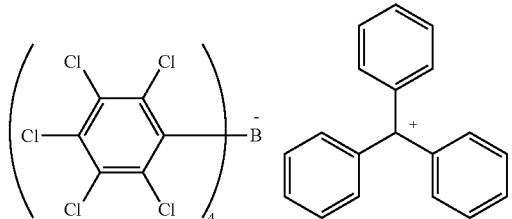
(B-19)
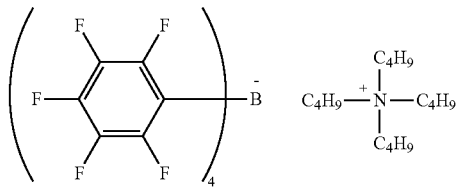
(B-20)
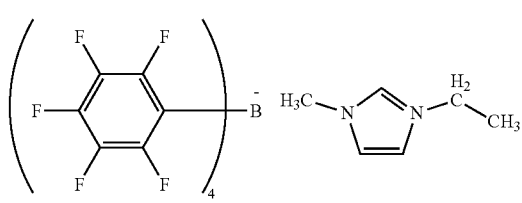

(B-21)
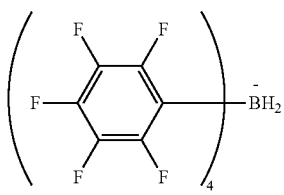

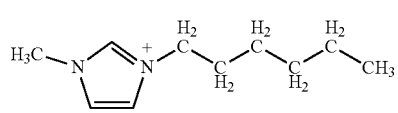
(B-22)

(B-27)
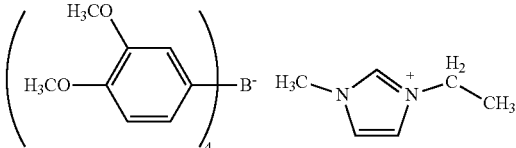

(B-28)
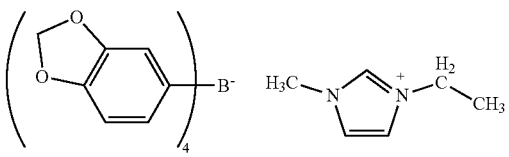

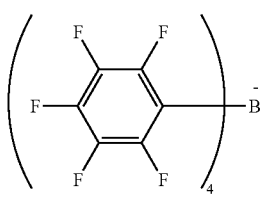

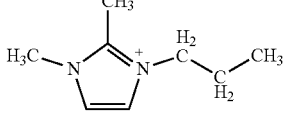
(B-23)

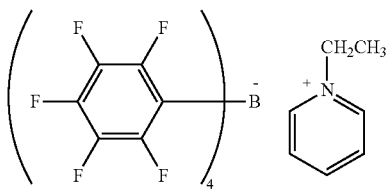
(B-24)

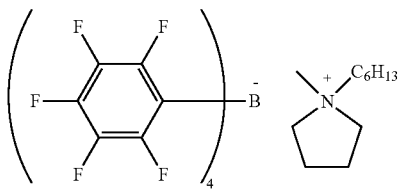
(B-25)

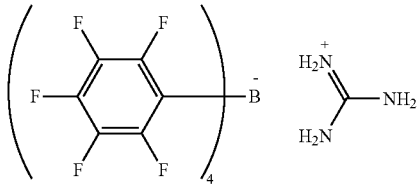
(B-26)

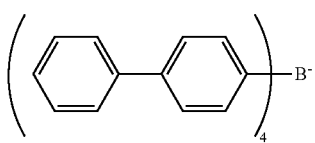

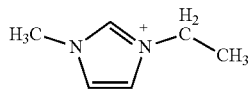

In the hole-transporting layer, a mass ratio (A:B) between the polymer A including the recurring unit represented by the General Formula (1) and the compound B represented by the General Formula (2) is not particularly limited and may be appropriately selected depending on the intended purpose. The mass ratio (A:B) is preferably from 20:1 through 1:1, more preferably from 10:1 through 1:1.

In addition to the aforementioned polymers, the hole-transporting layer may include a low-molecular-weight compound alone or may include a mixture of a low-molecular-weight compound and a high-molecular-weight compound.

A chemical structure of a low-molecular hole-transporting material is not particularly limited. Examples thereof include oxadiazole compounds, triphenylmethane compounds, pyrazoline compounds, hydrazone compounds, tetraarylbenzidine compounds, stilbene compounds, spirobifluorene compounds, and thiophene oligomers.

Examples of the oxadiazole compound include oxadiazole compounds described in, for example, Japanese Examined Patent publication No. 34-5466 and Japanese Unexamined Patent Application Publication No. 56-123544.

Examples of the triphenylmethane compound include triphenylmethane compounds described in, for example, Japanese Examined Patent publication No. 45-555.

Examples of the pyrazoline compound include pyrazoline compounds described in, for example, Japanese Examined Patent publication No. 52-4188.

Examples of the hydrazone compound include hydrazone compounds described in, for example, Japanese Examined Patent publication No. 55-42380.

Examples of the tetraarylbenzidine compound include tetraarylbenzidine compounds described in, for example, Japanese Unexamined Patent Application Publication No. 54-58445.

Examples of the stilbene compound include stilbene compounds described in, for example, Japanese Unexamined Patent Application Publication No. 58-65440 and Japanese Unexamined Patent Application Publication No. 60-98437.

Examples of the spirobifluorene compound include spirobifluorene compounds described in, for example, Japanese Unexamined Patent Application Publication No. 2007-115665, Japanese Unexamined Patent Application Publication No. 2014-72327, Japanese Unexamined Patent Application Publication No. 2001-257012, WO2004/063283, WO2011/030450, WO2011/45321, WO2013/042699, and WO2013/121835.

Examples of the thiophene oligomer include thiophene oligomers described in, for example, Japanese Unexamined Patent Application Publication No. 2-250881 and Japanese Unexamined Patent Application Publication No. 2013-033868.

When the polymer and the low-molecular-weight compound are mixed, a difference between the respective ionization potentials is preferably 0.2 eV or less. The ionization potential is energy necessary for extracting one electron from a molecule, and is represented by a unit of electron volt (eV). A method for measuring the ionization potential is not particularly limited. However, the ionization potential is preferably measured through photoelectron spectroscopy.

Other materials included in the hole-transporting layer are not particularly limited and may be appropriately selected depending on the intended purpose. Examples of the other materials include additives and oxidizing agents.

The additive is not particularly limited and may be appropriately selected depending on the intended purpose. Examples of the additive include: iodine; metal iodides such as lithium iodide, sodium iodide, potassium iodide, cesium iodide, calcium iodide, copper iodide, iron iodide, and silver iodide; quaternary ammonium salts such as tetraalkylammonium iodide and pyridinium iodide; metal bromides such as lithium bromide, sodium bromide, potassium bromide, cesium bromide, and calcium bromide; bromine salts of quaternary ammonium compounds such as tetraalkylammonium bromide and pyridinium bromide; metal chlorides such as copper chloride and silver chloride; metal acetates such as copper acetate, silver acetate, and palladium acetate; metal sulfates such as copper sulfate and zinc sulfate; metal complexes such as ferrocyanate-ferricyanate and ferrocene-ferricinium ion; sulfur compounds such as sodium polysulfide and alkylthiol-alkyl disulfide; viologen dyes; hydroquinones; and basic compounds such as pyridine, 4-t-butylpyridine, and benzimidazole.

An oxidizing agent can further be added. The kind of oxidizing agent is not particularly limited and may be appropriately selected depending on the intended purpose. Examples of the oxidizing agent include tris(4-bromophenyl) aminium hexachloroantimonate, silver hexafluoroantimonate, nitrosonium tetrafluoroborate, silver nitrate, cobalt complexes, and 4-isopropyl-4'-methyldiphenyliodonium tetrakis(pentafluorophenyl) borate. Note that, it is not necessary to oxidize the entire hole-transporting material with the oxidizing agent, and it is effective so long as the hole-transporting material is partially oxidized. After the reaction, the oxidizing agent may be removed or may not be removed outside the system.

Inclusion of the oxidizing agent in the hole-transporting layer can partially or entirely form the hole-transporting material into radical cations, which makes it possible to improve conductivity and to increase safety and durability of output characteristics.

An average thickness of the hole-transporting layer is not particularly limited and may be appropriately selected depending on the intended purpose. However, the average thickness thereof is preferably 0.01 micrometers or more but 20 micrometers or less, more preferably 0.1 micrometers or more but 10 micrometers or less, still more preferably 0.2 micrometers or more but 2 micrometers or less, on the photoelectric conversion layer.

The hole-transporting layer can be directly formed on the photoelectric conversion layer. A method for producing the hole-transporting layer is not particularly limited and may be appropriately selected depending on the intended purpose. Examples of the method include: a method in which a thin film is formed in vacuum through vacuum deposition; and a wet film forming method. In particular, among them, a wet film forming method is preferable, a method in which the hole-transporting layer is coated on the photoelectric conversion layer is more preferable, in terms of production cost.

The wet film forming method is not particularly limited and may be appropriately selected depending on the intended purpose. Examples of the wet film forming method include the dip method, the spray method, the wire bar method, the spin coating method, the roller coating method, the blade coating method, and the gravure coating method. As the wet printing method, methods such as relief printing, offset printing, gravure printing, intaglio printing, rubber plate printing, and screen printing may be used.

Moreover, the hole-transporting layer may be produced by forming a film in a supercritical fluid or subcritical fluid having a lower temperature and pressure than a critical point.

The supercritical fluid means a fluid, which exists as a non-condensable high-density fluid in a temperature and pressure region exceeding the limit (critical point) at which a gas and a liquid can coexist, does not condense even when being compressed, and is a fluid in a state of being equal to or higher than the critical temperature and the critical pressure. The supercritical fluid is not particularly limited and may be appropriately selected depending on the intended purpose, but is preferably a supercritical fluid having a low critical temperature.

The subcritical fluid is not particularly limited and may be appropriately selected depending on the intended purpose, so long as it is a fluid that exists as a high-pressure liquid in a temperature and pressure region near the critical point. The fluids as exemplified as the supercritical fluid can be suitably used as the subcritical fluid.

Examples of the supercritical fluid include carbon monoxide, carbon dioxide, ammonia, nitrogen, water, alcohol solvents, hydrocarbon solvents, halogen solvents, and ether solvents.

Examples of the alcohol solvent include methanol, ethanol, and n-butanol.

Examples of the hydrocarbon solvent include ethane, propane, 2,3-dimethylbutane, benzene, and toluene. Examples of the halogen solvent include methylene chloride and chlorotrifluoromethane.

Examples of the ether solvent include dimethyl ether.

These may be used alone or in combination.

Among them, carbon dioxide, which has a critical pressure of 7.3 MPa and a critical temperature of 31 degrees Celsius, is preferable because carbon dioxide easily generates a supercritical state, and it is incombustible and is easily handled.

A critical temperature and a critical pressure of the supercritical fluid are not particularly limited and may be appropriately selected depending on the intended purpose. The critical temperature of the supercritical fluid is preferably −273 degrees Celsius or more but 300 degrees Celsius or less, more preferably 0 degrees Celsius or more but 200 degrees Celsius or less.

In addition to the supercritical fluid and the subcritical fluid, an organic solvent or an entrainer may be used in combination. Adjustment of solubility in the supercritical fluid can be easily performed by adding the organic solvent or the entrainer.

The organic solvent is not particularly limited and may be appropriately selected depending on the intended purpose. Examples of the organic solvent include ketone solvents, ester solvents, ether solvents, amide solvents, halogenated hydrocarbon solvents, and hydrocarbon solvents.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diisopropyl ether, dimethoxy ethane, tetrahydrofuran, dioxolane, and dioxane.

Examples of the amide solvent include N,N-dimethylformamide, N,N-dimethylacetoamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

These may be used alone or in combination.

After the hole-transporting material is stacked on the photoelectric conversion layer, a press processing step may be performed. By performing the press processing, the hole-transporting material is more closely adhered to the photoelectric conversion layer, which may improve the power generation efficiency in some cases.

A method of the press processing is not particularly limited and may be appropriately selected depending on the intended purpose. Examples of the method include: the press molding method using a plate, which is represented by the infrared spectroscopy (IR) tablet molding device; and the roll press method using a roller.

A pressure at which the press processing is performed is preferably 10 kgf/cm$^2$ or more, more preferably 30 kgf/cm$^2$ or more.

The time of the pressing is not particularly limited and may be appropriately selected depending on the intended purpose. The time thereof is preferably 1 hour or less. Moreover, heat may be applied at the time of the pressing.

At the time of the pressing, a release agent may be disposed between a pressing machine and the electrode.

The release agent is not particularly limited and may be appropriately selected depending on the intended purpose. Examples of the release agent include fluororesins, such as polyethylene tetrafluoride, polychloro ethylene trifluoride, ethylene tetrafluoride-propylene hexafluoride copolymers, perfluoroalkoxy fluoride resins, polyvinylidene fluoride, ethylene-ethylene tetrafluoride copolymers, ethylenechloroethylene trifluoride copolymers, and polyvinyl fluoride. These may be used alone or in combination.

<Film Including Metal Oxide>

After the pressing but before disposition of a second electrode, a film including metal oxide may be disposed between the hole-transporting layer and the second electrode.

The metal oxide is not particularly limited and may be appropriately selected depending on the intended purpose. Examples of the metal oxide include molybdenum oxide, tungsten oxide, vanadium oxide, and nickel oxide. These may be used alone or in combination. Among them, molybdenum oxide is preferable.

A method for disposing the film including metal oxide on the hole-transporting layer is not particularly limited and may be appropriately selected depending on the intended purpose. Examples of the method include: a method in which a thin film is formed in vacuum such as sputtering and vacuum vapor deposition; and a wet film forming method.

The wet film forming method in the case where the film including metal oxide is formed is preferably a method in which a paste obtained by dispersing powders or sol of the metal oxide is prepared, followed by coating it on the hole-transporting layer.

The wet film forming method is not particularly limited and may be appropriately selected depending on the intended purpose. Examples of the wet film forming method include the dip method, the spray method, the wire bar method, the spin coating method, the roller coating method, the blade coating method, and the gravure coating method. As the wet printing method, methods such as relief printing, offset printing, gravure printing, intaglio printing, rubber plate printing, and screen printing may be used.

An average thickness of the film including metal oxide is not particularly limited and may be appropriately selected depending on the intended purpose. However, the average thickness thereof is preferably 0.1 nm or more but 50 nm or less, more preferably 1 nm or more but 10 nm or less.

<Second Electrode>

The second electrode is preferably formed on the hole-transporting layer or the film including metal oxide. The same as the first electrode can be used for the second electrode.

A shape, structure, and size of the second electrode are not particularly limited and may be appropriately selected depending on the intended purpose.

Examples of a material of the second electrode include metals, carbon compounds, conductive metal oxides, and conductive polymers.

Examples of the metal include platinum, gold, silver, copper, and aluminum.

Examples of the carbon compound include graphite, fullerene, carbon nanotube, and graphene.

Examples of the conductive metal oxide include ITO, FTO, and ATO.

Examples of the conductive polymer include polythiophene and polyaniline.

These may be used alone or in combination.

The second electrode can be appropriately formed on the hole-transporting layer by a method such as the coating method, the laminating method, the vacuum deposition method, the CVD method, or the bonding method, depending on the kind of material to be used or the kind of the hole-transporting layer.

In the photoelectric conversion element, at least one of the first electrode and the second electrode is preferably substantially transparent. For example, the first electrode is preferably transparent to allow incident light to pass from a side of the first electrode. In this case, a material that reflects light is preferably used for the second electrode, and glass, plastic, and a metal thin film on which a metal or conductive oxide is deposited are preferably used. In addition, provision of an anti-reflection layer at a side where the incident light is to be received is an effective means.

One example of a photoelectric conversion element will be described with reference to the drawing.

FIG. 1 is a schematic view of one example of a solar battery cell as one embodiment of a photoelectric conversion element.

A solar battery cell 50 of FIG. 1 includes a first electrode 2, a compact electron-transporting layer 3, a perovskite layer 5 that is a photoelectric conversion layer, a hole-transporting layer 6, and a second electrode 7.

The first electrode 2 is in contact with the compact electron-transporting layer 3.

The compact electron-transporting layer 3 is in contact with the perovskite layer 5.

The perovskite layer 5 is in contact with the hole-transporting layer 6.

The hole-transporting layer 6 is in contact with the second electrode 7.

(Photoelectric Conversion Module)

A photoelectric conversion module of the present disclosure includes a plurality of the photoelectric conversion elements of the present disclosure that are electrically coupled in series or in parallel.

The photoelectric conversion module includes a plurality of the photoelectric conversion elements of the present disclosure on a substrate, preferably further includes a second substrate different from the above substrate and a sealing member. The photoelectric conversion module includes other members if necessary.

Examples of the photoelectric conversion module includes photoelectric conversion modules.

The photoelectric conversion module is a photoelectric conversion module in which a plurality of the photoelectric conversion elements of the present disclosure are disposed on a substrate. Preferably, in at least two photoelectric conversion elements adjacent to each other, the hole-transporting layers are continuous, and, in at least two photoelectric conversion elements adjacent to each other, the first electrodes, the electron-transporting layers, and the photoelectric conversion layers are separated by the hole-transporting layers. Because the electron-transporting layers and the photoelectric conversion layers are separated, recombination of electrons due to diffusion is decreased in such a photoelectric conversion module. Therefore, the power generation efficiency can be maintained even after exposure to light of a high illuminance for a long period of time.

<Substrate>

A shape, structure, and size of the substrate are not particularly limited and may be appropriately selected depending on the intended purpose. Note that, the above substrate may be referred to as a first substrate hereinafter.

A material of the first substrate preferably has translucency and an insulation property. Examples of the material include glass, plastic films, and ceramics. Among them, in the case where a firing step for forming an electron-transporting layer is performed, a material having heat resistance to a firing temperature is preferable. Moreover, preferable examples of the first substrate include those having a flexibility.

<Second Substrate>

The second substrate is disposed so as to face the first substrate, so that the first substrate and the second substrate sandwich a plurality of the photoelectric conversion elements of the present disclosure.

A shape, structure, and size of the substrate are not particularly limited and may be appropriately selected depending on the intended purpose.

A material of the second substrate is not particularly limited and may be appropriately selected depending on the intended purpose. Examples of the material include glass, plastic films, metallic foil, and ceramics.

A convex-concave part may be formed at a connection part of the second substrate with a sealing member, which will be described hereinafter, in order to increase adhesiveness.

A formation method of the convex-concave part is not particularly limited and may be appropriately selected depending on the intended purpose. Examples of the formation method include the sand blasting method, the water blasting method, the chemical etching method, the laser processing method, and a method using abrasive paper.

A method for increasing adhesiveness between the second substrate and the sealing member may be, for example, a method for removing an organic matter on the surface of the second substrate or a method for improving hydrophilicity of the second substrate. The method for removing an organic matter on the surface of the second substrate is not particularly limited and may be appropriately selected depending on the intended purpose. Examples of the method include UV ozone washing and an oxygen plasma treatment.

<Sealing Member>

The sealing member is disposed between the first substrate and the second substrate, and seals the photoelectric conversion elements.

A material of the sealing member is not particularly limited and may be appropriately selected depending on the intended purpose. Examples of the material include cured products of acrylic resins and cured products of epoxy resins.

As the cured product of the acrylic resin, any material known in the art can be used, so long as the cured product of the acrylic resin is a product obtained by curing a monomer or oligomer including an acryl group in a molecule thereof.

As the cured product of the epoxy resin, any material known in the art can be used, so long as the cured product of the epoxy resin is a product obtained by curing a monomer or oligomer including an epoxy group in a molecule thereof.

Examples of the epoxy resin include water-dispersing epoxy resins, non-solvent epoxy resins, solid epoxy resins, thermosetting epoxy resins, curing agent-mixed epoxy resins, and ultraviolet ray-curable epoxy resins. Among them, thermosetting epoxy resins and ultraviolet ray-curable epoxy resins are preferable, ultraviolet ray-curable epoxy resins are more preferable. Note that, heating may be performed even when an ultraviolet ray-curable epoxy resin is used, and heating is preferably performed even after curing through ultraviolet ray irradiation.

Examples of the epoxy resin include bisphenol A-based epoxy resins, bisphenol F-based epoxy resins, novolac-based epoxy resins, alicyclic epoxy resins, long-chain aliphatic epoxy resins, glycidyl amine-based epoxy resins, glycidyl ether-based epoxy resins, and glycidyl ester-based epoxy resins. These may be used alone or in combination.

A curing agent or various additives are preferably mixed with the epoxy resin if necessary.

The curing agent is not particularly limited and may be appropriately selected depending on the intended purpose. The curing agents are classified into, for example, amine-based curing agents, acid anhydride-based curing agents, polyamide-based curing agents, and other curing agents.

Examples of the amine-based curing agent include: aliphatic polyamines such as diethylenetriamine and triethylenetetramine; and aromatic polyamines such as methphenylenediamine, diaminodiphenylmethane, and diaminodiphenylsulfone.

Examples of the acid anhydride-based curing agent include phthalic anhydride, tetrahydrophthalic anhydride, hexahydrophthalic anhydride, methyltetrahydrophthalic anhydride, methylnadic anhydride, pyromellitic anhydride, HET anhydride, and dodecenylsuccinic anhydride.

Examples of other curing agents include imidazoles and polymercaptan. These may be used alone or in combination.

The additive is not particularly limited and may be appropriately selected depending on the intended purpose.

Examples of the additive include fillers, gap agents, polymerization initiators, drying agents (moisture absorbents), curing accelerators, coupling agents, flexibilizers, colorants, flame retardant auxiliaries, antioxidants, and organic solvents. Among them, fillers, gap agents, curing accelerators, polymerization initiators, and drying agents (moisture absorbents) are preferable, fillers and polymerization initiators are more preferable.

Inclusion of the filler as the additive prevents entry of moisture or oxygen, and further can achieve effects such as reduction in volumetric shrinkage at the time of curing, reduction in an amount of outgas at the time of curing or heating, improvement of mechanical strength, and control of thermal conductivity or fluidity. Therefore, inclusion of the filler as the additive is considerably effective in maintaining stable output under various environments.

In addition, regarding output properties or durability of a photoelectric conversion element, not only influence of passing of moisture or oxygen, but also influence of outgas generated at the time of curing or heating the sealing member cannot be ignored. Particularly, the influence of outgas generated at the time of heating greatly affects output properties of the photoelectric conversion element stored under a high temperature environment.

Entry of moisture or oxygen can be prevented by adding a filler, a gap agent, or a drying agent to the sealing member. In addition, when an amount of the sealing member to be used can be reduced, an effect of reducing outgas can be achieved. Inclusion of the filler, the gap agent, or the drying agent in the sealing member is effective not only at the time of curing but also at the time when the photoelectric conversion element is stored under a high temperature environment.

The filler is not particularly limited and may be appropriately selected depending on the intended purpose. Examples of the filler include inorganic fillers such as crystalline or amorphous silica, talc, alumina, aluminum nitride, silicon nitride, calcium silicate, and calcium carbonate. These may be used alone or in combination.

An average primary particle diameter of the filler is preferably 0.1 micrometers or more but 10 micrometers or less, more preferably 1 micrometer or more but 5 micrometers or less. When the average primary particle diameter of the filler falls within the above preferable range, an effect of preventing entry of moisture or oxygen can be sufficiently obtained, the viscosity becomes appropriate, and adhesiveness to a substrate or a defoaming property is improved. In addition, it is also effective in controlling a width of the sealing part or workability.

An amount of the filler is preferably 10 parts by mass or more but 90 parts by mass or less, more preferably 20 parts by mass or more but 70 parts by mass or less, relative to the total amount of the sealing member (100 parts by mass). When the amount of the filler falls within the above preferable range, an effect of preventing entry of moisture or oxygen can be sufficiently obtained, the viscosity becomes appropriate, and adhesiveness and workability are good.

The gap agent is also called a gap controlling agent or a spacer agent. Inclusion of the gap agent as the additive makes it possible to control the gap of the sealing part. For example, when a sealing member is provided on a first substrate or a first electrode and a second substrate is provided thereon for sealing, a gap of the sealing part is matched with a size of the gap agent because the sealing member includes the gap agent. As a result, it is possible to easily control the gap of the sealing part.

The gap agent is not particularly limited and may be appropriately selected depending on the intended purpose, so long as it is particulate, has a uniform diameter, and has high solvent resistance and heat resistance. The gap agent is preferably a material which has high affinity to an epoxy resin and is in the form of sphere particles. Preferable examples of the gap agent include glass beads, silica fine particles, and organic resin fine particles. These may be used alone or in combination.

A particle diameter of the gap agent can be selected depending on a gap of the sealing part to be set. The particle diameter thereof is preferably 1 micrometer or more but 100 micrometers or less, more preferably 5 micrometers or more but 50 micrometers or less.

The polymerization initiator is not particularly limited and may be appropriately selected depending on the intended purpose, so long as polymerization is initiated through heat or light. Examples of the polymerization initiator include thermal polymerization initiators and photopolymerization initiators.

The thermal polymerization initiator is a compound that generates active species such as radicals and cations upon heating. Examples of the thermal polymerization initiator include azo compounds such as 2,2'-azobisbutyronitrile (AIBN) and peroxides such as benzoyl peroxide (BPO). Examples of the thermal cationic polymerization initiator include benzenesulfonic acid esters and alkyl sulfonium salts.

Meanwhile, as the photopolymerization initiator, a photocationic polymerization initiator is preferably used in the case of the epoxy resin. When the photocationic polymerization initiator is mixed with the epoxy resin and light is emitted, the photocationic polymerization initiator is decomposed to generate an acid, and the acid induces polymerization of the epoxy resin. Then, curing reaction proceeds. The photocationic polymerization initiator has such effects that less volumetric shrinkage during curing is caused, oxygen inhibition does not occur, and storage stability is high.

Examples of the photocationic polymerization initiator include aromatic diazonium salts, aromatic iodonium salts, aromatic sulfonium salts, metallocene compounds, and silanol-aluminum complexes.

Moreover, a photoacid generator having a function of generating an acid upon irradiation of light can be also used as the polymerization initiator. The photoacid generator functions as an acid for initiating cationic polymerization. Examples of the photoacid generator include onium salts such as ionic sulfonium salt-based onium salts and ionic iodonium salt-based onium salts including a cation part and an ionic part. These may be used alone or in combination.

An amount of the polymerization initiator added may be different depending on a material to be used. The amount of the polymerization initiator is preferably 0.5 parts by mass or more but 10 parts by mass or less, more preferably 1 part by mass or more but 5 parts by mass or less, relative to the total amount of the sealing member (100 parts by mass). When the amount of the polymerization initiator added falls within the aforementioned preferable range, curing appropriately proceeds, remaining uncured products can be decreased, and excessive outgassing can be prevented.

The drying agent is also called a moisture absorbent and is a material having a function of physically or chemically adsorbing or absorbing moisture. When the sealing member includes the drying agent, it is possible to further improve moisture resistance and to decrease influence of outgas.

The drying agent is not particularly limited and may be appropriately selected depending on the intended purpose, but is preferably a particulate material. Examples of the drying agent include inorganic water-absorbing materials such as calcium oxide, barium oxide, magnesium oxide, magnesium sulfate, sodium sulfate, calcium chloride, silica gel, molecular sieve, and zeolite. Among them, zeolite is preferable because zeolite absorbs a large amount of moisture. These may be used alone or in combination.

The curing accelerator is also called a curing catalyst and is a material that accelerates curing speed. The curing accelerator is mainly used for a thermosetting epoxy resin.

The curing accelerator is not particularly limited and may be appropriately selected depending on the intended purpose. Examples of the curing accelerator include: tertiary amine or tertiary amine salts such as DBU (1,8-diazabicyclo (5,4,0)-undecene-7) and DBN (1,5-diazabicyclo(4,3,0)-nonene-5); imidazole-based compounds such as 1-cyanoethyl-2-ethyl-4-methylimidazole and 2-ethyl-4-methylimidazole; and phosphine or phosphonium salts such as triphenylphosphine and tetraphenylphosphonium•tetraphenyl borate. These may be used alone or in combination.

The coupling agent is not particularly limited and may be appropriately selected depending on the intended purpose, so long as it is a material having an effect of increasing molecular binding force. Examples of the coupling agent include silane coupling agents. Specific examples thereof include: silane coupling agents such as 3-glycidoxypropyltrimethoxysilane, 3-glycidoxypropylmethyldimethoxysilane, 3-glycidoxypropylmethyldimethoxysilane, 2-(3,4-epoxycyclohexyl)ethyltrimethoxysilane, N-phenyl-γ-aminopropyltrimethoxysilane, N-(2-aminoethyl)3-aminopropylmethyldimethoxysilane, N-(2-aminoethyl)3-aminopropylmethyltrimethoxysilane, 3-aminopropyltriethoxysilane, 3-mercaptopropyltrimethoxysilane, vinyltrimethoxysilane, N-(2-(vinylbenzylamino) ethyl)3-aminopropyltrimethoxysilane hydrochloride, and 3-methacryloxypropyltrimethoxysilane. These may be used alone or in combination.

As the sealing member, epoxy resin compositions that are commercially available as sealing materials, seal materials, or adhesives have been known, and such commercially available products can be effectively used in the present embodiments. Among them, there are also epoxy resin compositions that are developed and are commercially available to be used in solar cells or organic EL elements, and such commercially available products can be particularly effectively used in the present embodiments. Examples of the commercially available epoxy resin compositions include: TB3118, TB3114, TB3124, and TB3125F (available from ThreeBond); World Rock 5910, World Rock 5920, and World Rock 8723 (available from Kyoritsu Chemical Co., Ltd.); and WB90US (P) (available from MORESCO Corporation).

A sheet-type sealing material may be used as the sealing material.

The sheet-type sealing material is a material where an epoxy resin layer has been formed on a sheet in advance. In the sheet, glass or a film having high gas barrier properties is used. A sealing member and a second substrate can be formed at one time by bonding the sheet-type sealing material onto the second substrate, followed by curing. A structure having a hollow part can be formed depending on a formation pattern of the epoxy resin layer formed on the sheet.

A method for forming the sealing member is not particularly limited and may be appropriately selected depending on the intended purpose. Examples of the method include the dispensing method, the wire bar method, the spin coating method, the roller coating method, the blade coating method, and the gravure coating method. Moreover, as a method for forming the sealing member, methods such as relief printing, offset printing, gravure printing, intaglio printing, rubber plate printing, and screen printing may be used.

Moreover, a passivation layer may be disposed between the sealing member and the second electrode. The passivation layer is not particularly limited and may be appropriately selected depending on the intended purpose, so long as the passivation layer is disposed in such a manner that the sealing member is not in contact with the second electrode. Examples of the passivation layer include aluminum oxide, silicon nitride, and silicon oxide.

<Other Members>

Other members are not particularly limited and may be appropriately selected depending on the intended purpose.

The photoelectric conversion module of the present disclosure can be applied to power source devices by using it in combination with, for example, a circuit board configured to control generated electric current. Examples of the devices using such a power source device include electronic calculators and watches. In addition, the power source device including the photoelectric conversion module of the present disclosure can be applied to, for example, mobile phones, electronic notebooks, and electronic paper. The power source device including the photoelectric conversion module of the present disclosure can be used as an auxiliary power supply configured to prolong a continuous operation time of rechargeable electrical appliances or battery-type electrical appliances, or as a power source that can be used in the nighttime by using it in combination with a secondary battery. Moreover, the photoelectric conversion module of the present disclosure can be used in IoT devices or artificial satellites as self-supporting power supplies that require neither replacement of a cell nor power source wirings.

(Electronic Device)

An electronic device of the present disclosure includes: the photoelectric conversion module of the present disclosure; and a device configured to be driven by electric power generated through photoelectric conversion of the photoelectric conversion module. The electronic device of the present disclosure further includes other devices if necessary.

(Power Supply Module)

A power supply module of the present disclosure includes: the photoelectric conversion module of the present disclosure; and a power supply integrated circuit (IC). The power supply module of the present disclosure further includes other devices if necessary.

A specific embodiment of an electronic device including the photoelectric conversion module of the present disclosure and a device configured to be driven by electric power obtained through power generation of the photoelectric conversion module will be described.

FIG. 2 is a block diagram of a mouse for a personal computer as one example of an electronic device of the present disclosure.

As presented in FIG. 2, a photoelectric conversion module, a power supply IC, and an electricity storage device are combined and the supplied electric power is allowed to pass to a power supply of a control circuit of a mouse. As a result, the electricity storage device is charged when the mouse is not used, and the mouse can be driven by the electric power. Therefore such a mouse that requires neither wiring nor replacement of a cell can be obtained. Since a cell is not required, a weight thereof can be decreased, which is effective.

FIG. 3 is a schematic external view presenting one example of the mouse presented in FIG. 2.

As presented in FIG. 3, a photoelectric conversion module, a power supply IC, and an electricity storage device are mounted inside a mouse, but an upper part of the photoelectric conversion element is covered with a transparent housing so that the photoelectric conversion element of the photoelectric conversion module receives light. Moreover, the whole housing of the mouse can be formed with a transparent resin. The arrangement of the photoelectric conversion element is not limited to the above. For example, the photoelectric conversion element may be arranged in a position to which light is emitted even when the mouse is covered with a hand, and such arrangement may be preferable.

Another embodiment of an electronic device including the photoelectric conversion module of the present disclosure and a device configured to be driven by electric power obtained through power generation of the photoelectric conversion module will be described.

FIG. 4 is a block diagram of a keyboard for a personal computer as one example of an electronic device of the present disclosure.

As presented in FIG. 4, a photoelectric conversion element of a photoelectric conversion module, a power supply IC, and an electricity storage device are combined, and the supplied electric power is allowed to pass to a power supply of a control circuit of a keyboard. As a result, the electricity storage device is charged when the keyboard is not used, and the keyboard can be driven by the electric power. Therefore, such a keyboard that requires neither wiring nor replacement of a cell can be obtained. Such a configuration is effective because a cell is not required and therefore a weight thereof can be decreased.

FIG. 5 is a schematic external view presenting one example of the keyboard presented in FIG. 4.

As presented in FIG. 5, a photoelectric conversion element of a photoelectric conversion module, a power supply IC, and an electricity storage device are mounted inside the keyboard, but an upper part of the photoelectric conversion element is covered with a transparent housing so that the photoelectric conversion element receives light. The whole housing of the keyboard can be formed with a transparent resin. The arrangement of the photoelectric conversion element is not limited to the above. In the case of a small keyboard in which a space for incorporating the photoelectric conversion element is small, a small photoelectric conversion element may be embedded in some keys as presented in FIG. 6, and such arrangement is effective.

Next, another embodiment of an electronic device including the photoelectric conversion module of the present disclosure and a device configured to be driven by electric power obtained through power generation of the photoelectric conversion module will be described.

FIG. 7 is a block diagram of a sensor as one example of an electronic device of the present disclosure.

As presented in FIG. 7, a photoelectric conversion element of a photoelectric conversion module, a power supply IC, and an electricity storage device are combined, and the supplied electric power is allowed to pass to a power supply of a sensor circuit. As a result, a sensor module can be constituted without requiring connection to an external power supply and without requiring replacement of a cell. A sensing target is, for example, temperature and humidity, illuminance, human detection, $CO_2$, acceleration, UV, noise, terrestrial magnetism, and atmospheric pressure, and such an electronic device can be applied to various sensors, which is effective. As presented in FIG. 7, the sensor module is configured to sense a target to be measured on a regular basis and to transmit the read data to a personal computer (PC) or a smartphone through wireless communication.

It is expected that use of sensors is significantly increased as the internet of things (IoT) society approaches. Replacing batteries of numerous sensors one by one is time consuming and is not realistic. Moreover, a sensor is installed at a position such as a ceiling and a wall where a cell is not easily replaced, and this arrangement makes workability bad. The fact that electricity can be supplied by the photoelectric conversion element is also significantly advantageous. In addition, the photoelectric conversion module of the present disclosure has such advantages that a high output can be obtained even with light of a low illuminance, and a high degree of freedom in installation can be achieved because dependence of light incident angle for the output is small.

Next, another embodiment of an electronic device including the photoelectric conversion module of the present disclosure and a device configured to be driven by electric power obtained through power generation of the photoelectric conversion module will be described.

FIG. 8 is a block diagram of a turntable as one example of an electronic device of the present disclosure.

As presented in FIG. 8, a photoelectric conversion element, a power supply IC, and an electricity storage device are combined, and the supplied electric power is allowed to pass to a power supply of a turntable control circuit. As a result, a turntable can be constituted without requiring connection to an external power supply and without requiring replacement of a cell.

The turntable is used in, for example, a display case in which products are displayed. Wiring of a power supply degrades appearance of the display, and moreover displayed products need to be removed at the time of replacing a cell, which is time-consuming. Use of the photoelectric conversion module of the present disclosure is effective because the aforementioned problems can be solved.

As described above, the electronic device including the photoelectric conversion module of the present disclosure and the device configured to be driven by electric power obtained through power generation of the photoelectric conversion module, and the power supply module have been described. However, the embodiments described are only part of applicable embodiments, and use of the photoelectric conversion module of the present disclosure is not limited to the above-described uses.

<Use>

The photoelectric conversion module of the present disclosure can function as a self-sustaining power supply, and electric power generated through photoelectric conversion can be used to drive a device. Since the photoelectric conversion module of the present disclosure can generate electricity by irradiation of light, it is not necessary to couple the electronic device to a power supply or to replace a cell. Therefore, the electronic device can be driven in a place where there is no power supply facility, the electronic device can be worn or carried, and the electronic device can be driven without replacement of a cell even in a place where a cell is not easily replaced. Moreover, when a dry cell is used, the electronic device becomes heavy by a weight of the dry cell, or the electronic device becomes large by a size of the dry cell. Therefore, there may be a problem in installing the electronic device on a wall or ceiling, or transporting the electronic device. However, since the photoelectric conversion module of the present disclosure is light and thin, it can be freely installed, and can be worn and carried, which is advantageous.

As described above, the photoelectric conversion module of the present disclosure can be used as a self-sustaining power supply, and can be combined with various electronic devices. For example, the photoelectric conversion module of the present disclosure can be used in combination with a display device (e.g., an electronic desk calculator, a watch, a mobile phone, an electronic organizer, and electronic paper), an accessory device of a personal computer (e.g., a mouse and a keyboard), various sensor devices (e.g., a temperature and humidity sensor and a human detection sensor), a transmitter (e.g., a beacon and a global positioning system (GPS)), and numerous electronic devices (e.g., an auxiliary lamp and a remote controller).

The photoelectric conversion module of the present disclosure is widely applied because it can generate electricity particularly with light of a low illuminance and can generate electricity indoors and in further darker shade. Moreover, the photoelectric conversion module is highly safe because liquid leakage found in the case of a dry cell does not occur, and accidental ingestion found in the case of a button cell does not occur. Furthermore, the photoelectric conversion module can be used as an auxiliary power supply for the purpose of prolonging a continuous operation time of a charge-type or dry cell-type electrical appliance. As described above, when the photoelectric conversion module of the present disclosure is combined with a device configured to be driven by electric power generated through photoelectric conversion of the photoelectric conversion module, it is possible to obtain an electronic device that is light and easy to use, has a high degree of freedom in installation, does not require replacement of a cell, is excellent in safety, and is effective in decreasing environmental loads.

FIG. 9 presents a basic configuration diagram of an electronic device obtained by combining the photoelectric conversion module of the present disclosure with a device configured to be driven by electric power generated through photoelectric conversion of the photoelectric conversion module. The electronic device can generate electricity when the photoelectric conversion element is irradiated with light, and can extract electric power. A circuit of the device can be driven by the generated electric power.

Since the output of the photoelectric conversion element of the photoelectric conversion module varies depending on circumferential illuminance, the electronic device presented in FIG. 9 may not be stably driven in some cases. In this case, as presented in FIG. 10, a power supply IC for a photoelectric conversion element can be incorporated between the photoelectric conversion element and the circuit of the device in order to supply stable voltage to a side of the circuit, and such arrangement is effective.

The photoelectric conversion element of the photoelectric conversion module can generate electricity so long as light of a sufficient illuminance is emitted. However, when there is not enough illuminance to generate electricity, desired electric power cannot be obtained, which is a disadvantage of the photoelectric conversion element. In this case, as presented in FIG. 11, when an electricity storage device such as a capacitor is mounted between a power supply IC and a device circuit, excess electric power from the photoelectric conversion element can be stored in the electricity storage device. In addition, the electric power stored in the electricity storage device can be supplied to a device circuit to thereby enable stable operation when the illuminance is too low or even when light is not applied to the photoelectric conversion element.

As described above, the electronic device obtained by combining the photoelectric conversion module of the present disclosure with the device circuit can be driven even in an environment without a power supply, does not require replacement of a cell, and can be stably driven, in combination with a power supply IC or an electricity storage device. Therefore, it is possible to make the most of advantages of the photoelectric conversion element.

Meanwhile, the photoelectric conversion module of the present disclosure can also be used as a power supply module, and such use is effective. As presented in FIG. 12, for example, when the photoelectric conversion module of the present disclosure is coupled to a power supply IC for a photoelectric conversion element, it is possible to constitute a DC power supply module, which is capable of supplying electric power generated through photoelectric conversion of the photoelectric conversion element of the photoelectric conversion module to the power supply IC at a predetermined voltage level.

Moreover, as presented in FIG. 13, when an electricity storage device is added to a power supply IC, electric power generated by the photoelectric conversion element of the photoelectric conversion module can be stored in the electricity storage device. Therefore, it is possible to constitute a power supply module capable of supplying electric power when the illuminance is too low or even when light is not applied to the photoelectric conversion element.

The power supply modules of the present disclosure presented in FIG. 12 and FIG. 13 can be used as a power supply module without replacement of a cell as in case of conventional primary cells.

EXAMPLES

Hereinafter, the present disclosure will be described by way of Examples and Comparative Examples. However, the present disclosure should not be construed as being limited to the Examples exemplified herein.

Production Example 1: Synthesis of Polymer

A polymer (A-05) expressed by the following formula was synthesized through the following reaction.

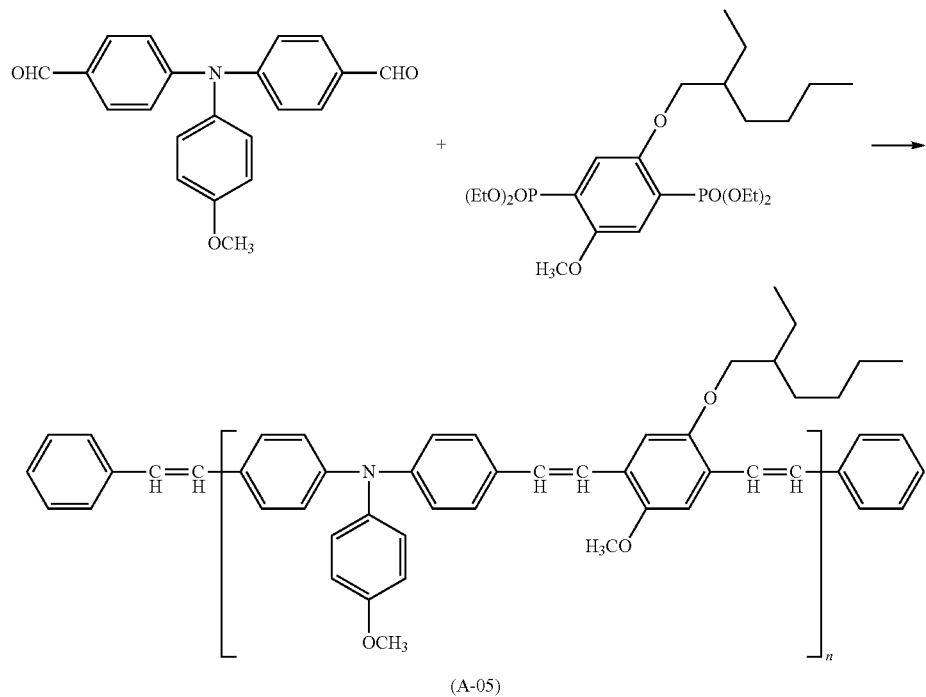

(A-05)

Note that, "Et" represents an ethyl group. "n" represents an integer that allows the polymer (A-05) to have a weight average molecular weight of 20,000.

A 100-ml four-neck flask was charged with the above dialdehyde compound (0.66 g) (2.0 mmol) and diphosphonate (1.02 g) (2.0 mmol), and the resultant was purged with nitrogen, followed by addition of tetrahydrofuran (75 ml). To the solution, a 1.0 mol·dm$^{-3}$ tetrahydrofuran solution of potassium t-butoxide (6.75 ml) (6.75 mmol) was added dropwise, followed by stirring at room temperature for 2 hours. Then, diethyl benzylphosphonate and benzaldehyde were sequentially added thereto, followed by stirring for another 2 hours.

Acetic acid (about 1 ml) was added to complete the reaction, and the solution was washed with water. After the solvent was removed under reduced pressure, the resultant was reprecipitated using tetrahydrofuran and methanol to perform purification, to obtain a polymer (A-05) (0.95 g). The number average molecular weight of the polymer (A-05) in terms of polystyrene measured through gel filtration chromatography (GPC) was 8,500, and the weight average molecular weight of the polymer (A-05) in terms of polystyrene measured through gel filtration chromatography (GPC) was 20,000. The ionization potential measured using a photoemission yield spectrometer AC-2 (obtained from RIKEN KEIKI Co., Ltd.) was 5.20 eV. All the ionization potentials described below are values measured by the AC-2.

Example 1

<Production of Solar Battery Cell>

An indium tin oxide (ITO) glass substrate was used as a substrate and a first electrode.

A tin oxide colloidal solution (obtained from Alfa Aesar) was coated on the ITO glass substrate, and was heated and dried at 100 degrees Celsius for 1 hour. Then, a 0.1 mM (where M means mol/dm$^3$) solution, which was obtained dissolving (1-aminoethyl)phosphonic acid (obtained from Aldrich) in ethanol, was coated on the aforementioned film using the spin coating method, and was dried at 70 degrees Celsius for 10 minutes to obtain an electron-transporting layer.

Then, lead(II) iodide (0.5306 g), lead(II) bromide (0.0736 g), methylamine bromide (0.0224 g), and formamidine hydroiodide (0.1876 g) were added to N,N-dimethylformamide (0.8 ml) and dimethyl sulfoxide (0.2 ml), and were heated upon stirring at 60 degrees Celsius, to obtain a solution. Then, the solution was coated on the electron-transporting layer by the spin coating method while chlorobenzene (0.3 ml) was added thereto, to form a perovskite film. The perovskite film was dried at 150 degrees Celsius for 30 minutes to form a perovskite layer (photoelectric conversion layer). An average thickness of the perovskite layer was adjusted so as to be from 200 nm through 350 nm. Furthermore, a 20 mM solution obtained by dissolving iodide-n-hexylamine in ethanol was coated on the formed perovskite layer through spin coating.

Then, the polymer (A-05) (73.6 mg) produced in Production Example 1 and an additive (7.4 mg) expressed by (B-14) as an additive were weighed and dissolved in chlorobenzene (3.0 ml). By the spin coating method, the obtained solution was coated on the stacked product obtained by the aforementioned step, to form a hole-transporting layer. Note that, an average thickness of the hole-transporting layer (part on the perovskite layer) was adjusted so as to be from 50 nm through 120 nm.

Furthermore, gold (100 nm) was vapor-deposited on the stacked product under vacuum.

As a result, a solar battery cell 1 was obtained.

<<Evaluation of Solar Cell Characteristics>>

The obtained solar battery cell 1 was evaluated for solar cell characteristics (initial characteristics) using a solar cell evaluation system (obtained from NF CORPORATION, product name: As-510-PV03) while light was emitted using a solar simulator (AM 1.5, 100 mW/cm$^2$). Results are presented in Table 2.

<Maintenance Rate of Conversion Efficiency>

A maintenance rate (%) of conversion efficiency of the obtained solar battery cell 1 was determined. The maintenance rate of conversion efficiency is a rate of conversion efficiency in characteristics obtained after continuous irradiation for 500 hours (AM 1.5, 100 mW/cm$^2$) relative to the conversion efficiency in the initial characteristics. Results are presented in Table 2.

Examples 2 to 25

Solar battery cells of Examples 2 to 25 were produced and evaluated in the same manner as in Example 1 except that the polymer A and the additive B used for forming the hole-transporting layer, and the mass ratio (A:B) were changed to a polymer A, an additive B, and a mass ratio (A:B) of Examples 2 to 25 described in Table 2. Results are presented in Table 2.

Comparative Example 1

A solar battery cell was produced and evaluated in the same manner as in Example 1 except that the additive was changed to lithium bis(trifluoromethanesulfonyl)imide (LiTFSI) (10 mg) and 4-t-butylpyridine (tBP) (13 mg). Results are presented in Table 2.

Comparative Example 2

A solar battery cell was produced and evaluated in the same manner as in Example 1 except that the polymer used for forming the hole-transporting layer was changed to a polymer described in Table 2. Results are presented in Table 2.

| | Polymer: A | Additive: B | Mass ratio (AB) | Voc (V) | Jsc (mA/cm$^2$) | FF | η (%) | Maintenance rate of conversion efficiency (%) |
|---|---|---|---|---|---|---|---|---|
| Example 1 | A-05 | B-14 | 10:1 | 1.05 | 21.9 | 0.70 | 16.1 | 97.5 |
| Example 2 | A-05 | B-02 | 10:1 | 1.03 | 21.0 | 0.69 | 14.9 | 92.4 |
| Example 3 | A-05 | B-07 | 10:1 | 1.06 | 20.9 | 0.71 | 15.7 | 94.3 |
| Example 4 | A-05 | B-09 | 10:1 | 1.06 | 20.8 | 0.72 | 15.9 | 89.1 |
| Example 5 | A-05 | B-13 | 10:1 | 1.02 | 21.6 | 0.70 | 15.4 | 91.2 |
| Example 6 | A-05 | B-15 | 10:1 | 1.00 | 20.8 | 0.72 | 15.0 | 88.2 |
| Example 7 | A-05 | B-19 | 10:1 | 1.02 | 20.6 | 0.72 | 15.1 | 94.2 |
| Example 8 | A-05 | B-22 | 10:1 | 1.06 | 21.7 | 0.69 | 15.9 | 96.1 |
| Example 9 | A-04 | B-14 | 10:1 | 0.98 | 20.5 | 0.72 | 14.5 | 91.2 |
| Example 10 | A-06 | B-14 | 10:1 | 0.99 | 20.4 | 0.71 | 14.3 | 88.2 |
| Example 11 | A-13 | B-14 | 10:1 | 1.01 | 20.3 | 0.71 | 14.6 | 89.4 |
| Example 12 | A-05 | B-14 | 100:1 | 0.73 | 19.7 | 0.61 | 8.8 | 72.3 |
| Example 13 | A-05 | B-14 | 50:1 | 0.87 | 19.4 | 0.61 | 10.3 | 72.3 |
| Example 14 | A-05 | B-14 | 20:1 | 1.00 | 20.8 | 0.72 | 15.0 | 94.6 |
| Example 15 | A-05 | B-14 | 15:1 | 1.04 | 21.3 | 0.69 | 15.3 | 93.7 |
| Example 16 | A-05 | B-14 | 5:1 | 1.06 | 20.8 | 0.72 | 15.9 | 96.3 |
| Example 17 | A-05 | B-14 | 1.25:1 | 1.03 | 22.4 | 0.63 | 11.5 | 92.9 |
| Example 18 | A-05 | B-14 | 1:1 | 0.99 | 23.9 | 0.56 | 13.2 | 93.2 |
| Example 19 | A-05 | B-14 | 0.5:1 | 0.86 | 24.3 | 0.48 | 10.0 | 82.5 |
| Example 20 | A-05 | B-14 | 0.1:1 | 0.71 | 19.4 | 0.45 | 6.2 | 71.2 |
| Example 21 | A-02 | B-14 | 5:1 | 1.02 | 20.8 | 0.71 | 15.1 | 91.2 |
| Example 22 | A-03 | B-13 | 15:1 | 1.03 | 20.8 | 0.71 | 15.2 | 93.2 |
| Example 23 | A-03 | B-14 | 10:1 | 1.03 | 20.3 | 0.70 | 14.6 | 97.1 |
| Example 24 | A-07 | B-13 | 15:1 | 1.01 | 20.4 | 0.69 | 14.2 | 93.2 |
| Example 25 | A-07 | B-14 | 10:1 | 1.02 | 22.0 | 0.68 | 15.3 | 89.8 |
| Comparative Example 1 | A-05 | LiTFSI, tBP | — | 0.96 | 12.7 | 0.29 | 3.5 | 62.9 |
| Comparative Example 2 | P3HT | B-14 | 10:1 | 0.88 | 18.5 | 0.60 | 9.8 | 67.2 |

In Table 2, the meanings of the respective signs are as follows.

"Voc" means an open circuit voltage.

"Jsc" means a short circuit current density.

"FF" means a form factor.

"η" means a photoelectric conversion efficiency.

"P3HT" in Comparative Example 2 is a polymer expressed by the following Structural Formula (obtained from Aldrich).

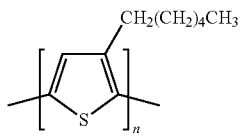

Here, n represents an integer of 1 or more.

It is found from the results of Table 2 that those of Examples 1 to 25 have a good durability because they are considerably excellent in the initial characteristics, and have 80% or more of the maintenance rate of conversion efficiency obtained after continuous irradiation for 500 hours. Meanwhile, it is clear that those of Comparative Examples 1 and 2 exhibit not only low initial characteristics but also a low maintenance rate of conversion efficiency obtained after continuous irradiation for 500 hours.

As described above, when a hole-transporting layer includes a polymer including a recurring unit represented by the General Formula (1) and a compound represented by the General Formula (2), the photoelectric conversion element of the present disclosure can maintain not only the initial characteristics but also the power generation efficiency even after exposure to light of a high illuminance for a long period of time.

Referential Example 101

<Production of Solar Battery Cell>

An indium tin oxide (ITO) glass substrate was used as a substrate and a first electrode.

A tin oxide colloidal solution (obtained from Alfa Aesar) was coated on the ITO glass substrate, and was heated and dried at 100 degrees Celsius for 1 hour. Then, a 0.1 mM (where M means mol/dm$^3$) solution, which was obtained dissolving (1-aminoethyl)phosphonic acid (obtained from Aldrich) in ethanol, was coated on the aforementioned film using the spin coating method, and was dried at 70 degrees Celsius for 10 minutes to obtain an electron-transporting layer.

Then, lead(II) iodide (0.5306 g), lead(II) bromide (0.0736 g), methylamine bromide (0.0224 g), and formamidine hydroiodide (0.1876 g) were added to N,N-dimethylformamide (0.8 ml) and dimethyl sulfoxide (0.2 ml), and were heated under stirring at 60 degrees Celsius, to obtain a solution. The obtained solution was coated on the electron-transporting layer by the spin coating method while chlorobenzene (0.3 ml) was added thereto, to form a perovskite film. The perovskite film was dried at 150 degrees Celsius for 30 minutes to form a perovskite layer (photoelectric conversion layer). An average thickness of the perovskite layer was adjusted so as to be from 200 nm through 350 nm. Furthermore, a 20 mM solution obtained by dissolving iodide-n-hexyltrimethylamine in ethanol was coated on the formed perovskite layer through spin coating.

Then, the polymer (A-05) (73.6 mg) produced in Production Example 1 and 4-isopropyl-4'-methyldiphenyliodonium tetrakis(pentafluorophenyl) borate (7.4 mg) were weighed and dissolved in chlorobenzene (3.0 ml). By the spin coating method, the obtained solution was coated on the stacked product obtained by the aforementioned step, to form a hole-transporting layer. Note that, an average thickness of the hole-transporting layer (part on the perovskite layer) was adjusted so as to be from 50 nm through 120 nm.

Furthermore, gold (100 nm) was vapor-deposited on the stacked product under vacuum.

As a result, a solar battery cell 101 was obtained.

<<Evaluation of Solar Cell Characteristics>>

The obtained solar battery cell 101 was evaluated for solar cell characteristics (initial characteristics) using a solar cell evaluation system (obtained from NF CORPORATION, product name: As-510-PV03) while light was emitted using a solar simulator (AM 1.5, 100 mW/cm$^2$). Results are presented in Table 3.

Referential Examples 102 to 115

In the same manner as in Referential Example 101 except that (1-aminoethyl)phosphonic acid and iodide-n-hexyltrimethylamine were changed to the compounds described in Table 3, solar battery cells were produced and evaluated. Results are presented in Table 3.

TABLE 3

| Ref. Ex. | Compound | Organic salt or inorganic salt | Voc (V) | Jsc (mA/cm$^2$) | FF | η (%) |
|---|---|---|---|---|---|---|
| 101 | (1-Aminoethyl)phosphonic acid | Iodide-n-hexyltrimethylamine | 1.05 | 21.9 | 0.70 | 16.1 |
| 102 | (2-Aminoethyl)phosphonic acid | Iodide-n-hexyltrimethylamine | 1.05 | 22.4 | 0.69 | 16.2 |
| 103 | (1-Aminoethyl)phosphonic acid | Bromide-n-hexyltrimethylamine | 1.08 | 21.8 | 0.70 | 16.5 |
| 104 | (2-Aminoethyl)phosphonic acid | Bromide-n-hexyltimethylamine | 1.06 | 22.0 | 0.70 | 16.3 |
| 105 | (1-Aminoethyl)phosphonic acid | Phenethylamine iodide | 1.03 | 21.8 | 0.68 | 15.3 |
| 106 | Methylphosphonic acid | Bromide-n-hexyltrimethylamine | 1.02 | 21.8 | 0.67 | 14.9 |
| 107 | Phenylphosphonic acid | Bromide-n-hexyltrimethylamine | 1.01 | 21.5 | 0.68 | 14.8 |
| 108 | Methanesulfonic acid | Bromide-n-hexyltrimethylamine | 0.98 | 22.1 | 0.66 | 14.3 |
| 109 | Methanesulfonic acid | Phenethylamine iodide | 0.98 | 21.7 | 0.67 | 14.2 |
| 110 | 2-Thiopheneboronic acid | Bromide-n-hexyltrimethylamine | 0.96 | 21.5 | 0.65 | 13.4 |
| 111 | Methyltrichlorosilane | Bromide-n-hexyltrimethylamine | 0.99 | 21.6 | 0.66 | 14.1 |
| 112 | n-Decyltriethoxysilane | Bromide-n-hexyltrimethylamine | 0.98 | 21.6 | 0.64 | 13.5 |
| 113 | n-Decyltriethoxysilane | Phenethylamine iodide | 0.97 | 21.0 | 0.68 | 13.8 |
| 114 | (1-Aminoethyl)phosphonic acid | Cesium iodide | 0.97 | 20.4 | 0.67 | 13.3 |
| 116 | (1-Aminoethyl)phosphonic acid | Rubidium iodide | 0.99 | 20.5 | 0.65 | 13.2 |

In Table 3, iodide-n-hexyltrimethylamine is n-hexylamine hydroiodide.
Bromide-n-hexyltrimethylamine is n-hexylamine hydrobromide.
Phenethylamine iodide is 2-phenethylamine hydroiodide.
In Table 3 and Table 4, the meanings of the respective signs are as follows.
"Voc" means an open circuit voltage.
"Jsc" means a short circuit current density.
"FF" means a form factor.
"η" means a photoelectric conversion efficiency.

Referential Comparative Examples 101 to 104

In the same manner as in Referential Example 101 except that (1-aminoethyl)phosphonic acid and iodide-n-hexyltrimethylamine were changed to the compounds described in Table 4, solar battery cells were produced and evaluated. Results are presented in Table 4.

TABLE 4

| Ref. Comp. Ex. | Compound | Organic salt or inorganic salt | Voc (V) | Jsc (mA/cm$^2$) | FF | η (%) |
|---|---|---|---|---|---|---|
| 101 | Methylphosphonic acid | None | 0.91 | 21.7 | 0.60 | 11.8 |
| 102 | None | Phenethylamine iodide | 0.89 | 21.1 | 0.59 | 11.1 |
| 103 | n-Decylic acid | None | 0.91 | 21.0 | 0.58 | 11.1 |
| 104 | n-Decylic acid | Phenethylamine iodide | 0.91 | 20.8 | 0.61 | 11.5 |

As is clear from Referential Examples 101 to 115 and Referential Comparative Examples 101 and 102, the cases of using phosphonic acid, sulfonic acid, a halogenated silyl compound, or an alkoxysilyl compound (hereinafter referred to as "acid compound") and inserting the organic or inorganic salt to between the photoelectric conversion layer and the hole-transporting layer is obviously higher in conversion efficiency than the cases of using the acid compound alone or the cases of using the organic or inorganic salt alone. Further, as is clear from Referential Comparative Examples 103 and 104, it is also obvious that conversion efficiency does not increase even when using carboxylic acid as the acid compound.

Also, as is clear from Referential Examples 101 to 104 and Referential Example 106, it is obvious that use of a compound having an amino group as the acid compound increases conversion efficiency.

Aspects of the present disclosure are as follows, for example.

<1> A photoelectric conversion element including:

a first electrode;

an electron-transporting layer;

a photoelectric conversion layer;

a hole-transporting layer; and a second electrode, wherein the electron-transporting layer includes an electron-transporting material, wherein the electron-transporting layer includes, on the electron-transporting material on a surface thereof at a side of the photoelectric conversion layer, at least one compound selected from the group consisting of a phosphonic acid compound, a boronic acid compound, a sulfonic acid compound, a halogenated silyl compound, and an alkoxysilyl compound, and wherein the photoelectric conversion element includes at least one salt selected from the group consisting of an organic salt and an inorganic salt between the photoelectric conversion layer and the hole-transporting layer.

<2> The photoelectric conversion element according to <1>, wherein the compound includes a nitrogen atom.

<3> The photoelectric conversion element according to <1> or <2>, wherein the compound is represented by General Formula (3) below:

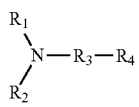

General Formula (3)

where $R_1$ and $R_2$, which may be identical to or different from each other, represent a hydrogen atom, an alkyl group, an aryl group, or a heterocycle, $R_3$ represents a bivalent alkylene group, a bivalent aryl group, or a bivalent heterocycle, $R_4$ represents a phosphonic acid group, a boronic acid group, a sulfonic acid group, a halogenated silyl group, or an alkoxysilyl group, and $R_1$ or $R_2$, $R_3$, and N may be joined together to form a ring structure.

<4> The photoelectric conversion element according to any one of <1> to <3>, wherein the salt includes a halogen atom as a cation.

<5> The photoelectric conversion element according to any one of <1> to <3>, wherein the organic salt is a halogenated hydroacid salt of amine, and the inorganic salt is a halide of an alkali metal.

<6> The photoelectric conversion element according to any one of <1> to <5>, wherein the photoelectric conversion layer is a perovskite layer including a perovskite compound.

<7> The photoelectric conversion element according to <6>, wherein the perovskite compound is represented by General Formula (4) below:

$$X_\alpha Y_\beta Z_\gamma$$ General Formula (4)

where a ratio of α:β:γ is 3:1:1; β and γ are each an integer of more than 1; X represents a halogen atom; Y represents an organic compound including an amino group; and Z represents a metal ion.

<8> The photoelectric conversion element according to any one of <1> to <7>, wherein the hole-transporting layer includes a polymer including a recurring unit represented by General Formula (1) below:

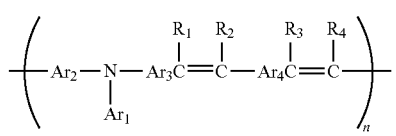

General Formula (1)

where Ar$_1$ represents an aromatic hydrocarbon group, and the aromatic hydrocarbon group may be substituted with a substituent; Ar$_2$ and Ar$_3$ each independently represent a bivalent group of a monocyclic aromatic hydrocarbon group, a non-condensed polycyclic aromatic hydrocarbon group, or a condensed polycyclic aromatic hydrocarbon group, which may be substituted with a substituent; Ar$_4$ represents a bivalent group of benzene, thiophene, biphenyl, anthracene, or naphthalene, which may be substituted with a substituent; R$_1$ to R$_4$ each independently represent a hydrogen atom, an alkyl group, or an aryl group; and n represents an integer that is 2 or more and allows the polymer represented by the General Formula (1) to have a weight average molecular weight of 2,000 or more.

<9> The photoelectric conversion element according to any one of <1> to <8>, wherein the electron-transporting material is a metal oxide.

<10> The photoelectric conversion element according to <9>, wherein the metal oxide includes tin oxide.

<11> The photoelectric conversion element according to any one of <1> to <10>, wherein a roughness factor of a surface of the electron-transporting layer at a side of the photoelectric conversion layer is 10 or less.

<12> A photoelectric conversion module including photoelectric conversion elements that are electrically coupled in series or in parallel, each of the photoelectric conversion elements being the photoelectric conversion element according to any one of <1> to <11>.

<13> An electronic device including:
the photoelectric conversion module according to <12>; and
a device configured to be driven by electric power generated through photoelectric conversion of the photoelectric conversion module.

<14> An electronic device including:
the photoelectric conversion module according to <12>;
an electricity storage device configured to store electric power generated through photoelectric conversion of the photoelectric conversion module; and
a device configured to be driven by at least one of the electric power generated through photoelectric conversion of the photoelectric conversion module and the electric power stored in the electricity storage device.

<15> A power supply module including:
the photoelectric conversion module according to <12>; and
a power supply integrated circuit.

The photoelectric conversion element according to any one of <1> to <11>, the photoelectric conversion module according to <12>, the electronic device according to <13> or <14>, and the power supply module according to <15> can solve the conventionally existing problems and can achieve the object of the present disclosure.

<101> A photoelectric conversion element including:
a first support;
a first electrode;
an electron-transporting layer;
a photoelectric conversion layer;
a hole-transporting layer; and
a second electrode,
wherein the hole-transporting layer includes a polymer including a recurring unit represented by General Formula (1) below and a compound represented by General Formula (2) below:

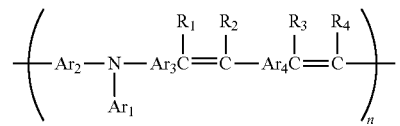

General Formula (1)

where, in the General Formula (1), Ar$_1$ represents an aromatic hydrocarbon group, and the aromatic hydrocarbon group may be substituted with a substituent; Ar$_2$ and Ar$_3$ each independently represent a bivalent group of a monocyclic aromatic hydrocarbon group, a non-condensed polycyclic aromatic hydrocarbon group, or a condensed polycyclic aromatic hydrocarbon group, which may be substituted with a substituent; Ar$_4$ represents a bivalent group of benzene, thiophene, biphenyl, anthracene, or naphthalene, which may be substituted with a substituent; R$_1$ to R$_4$ each independently represent a hydrogen atom, an alkyl group, or an aryl group; and n represents an integer that is 2 or more and allows the polymer represented by the General Formula (1) to have a weight average molecular weight of 2,000 or more; and

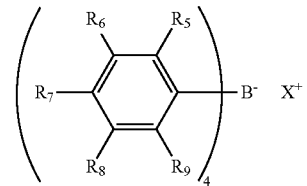

General Formula (2)

where, in the General Formula (2), R$_5$ to R$_9$, which may be identical to or different from each other, represent a hydrogen atom, a halogen atom, an alkyl group, an alkoxy group, or an aryl group; and X represents a cation.

<102> The photoelectric conversion element according to <101>,
wherein a mass ratio (A:B) between the polymer A including the recurring unit represented by the General Formula (1) and the compound B represented by the General Formula (2) is from 20:1 through 1:1.

<103> The photoelectric conversion element according to <101> or <102>,
wherein the photoelectric conversion layer includes a compound represented by General Formula (4) below:

$$X_\alpha Y_\beta Z_\gamma$$  General Formula (4)

where a ratio of α:β:γ is 3:1:1; β and γ are each an integer of more than 1; X represents a halogen atom; Y represents an organic compound including an amino group; and Z represents a metal ion.

<104> The photoelectric conversion element according to any one of <101> to <103>,
wherein the photoelectric conversion layer is a perovskite layer including a perovskite compound.

<105> The photoelectric conversion element according to <104>,
wherein the perovskite layer includes a Sb atom, a Cs atom, a Rb atom, or a K atom.

<106> The photoelectric conversion element according to any one of <101> to <105>, further including an amine compound between the photoelectric conversion layer and the hole-transporting layer, and the amine compound is different from an amine compound in the photoelectric conversion layer.

<107> The photoelectric conversion element according to any one of <101> to <106>, wherein the electron-transporting layer includes tin oxide.

<108> A photoelectric conversion module including photoelectric conversion elements that are electrically coupled in series or in parallel, each of the photoelectric conversion elements being the photoelectric conversion element according to any one of <101> to <107>.

<109> An electronic device including:
the photoelectric conversion module according to <108>; and
a device configured to be driven by electric power generated through photoelectric conversion of the photoelectric conversion module.

<110> An electronic device including:
the photoelectric conversion module according to <108>;
an electricity storage device configured to store electric power generated through photoelectric conversion of the photoelectric conversion module; and
a device configured to be driven by at least one of the electric power generated through photoelectric conversion of the photoelectric conversion module and the electric power stored in the electricity storage device.

<111> A power supply module including:
the photoelectric conversion module according to <108>; and
a power supply integrated circuit.

The photoelectric conversion element according to any one of <101> to <107>, the photoelectric conversion module according to <108>, the electronic device according to <109> or <110>, and the power supply module according to <111> can solve the conventionally existing problems and can achieve the object of the present disclosure.

REFERENCE SIGNS LIST 2 first electrode
3 compact electron-transporting layer (compact layer)
5 perovskite layer
6 hole-transporting layer
7 second electrode
50 solar battery cell

The invention claimed is:

1. A photoelectric conversion element comprising:
a first support;
a first electrode;
an electron-transporting layer;
a photoelectric conversion layer;
a hole-transporting layer that transports holes generated in the photoelectric conversion layer to a second electrode; and
the second electrode,
wherein the hole-transporting layer comprises a polymer comprising a recurring unit represented by General Formula (1) below and a compound represented by General Formula (2) below:

General Formula (1)

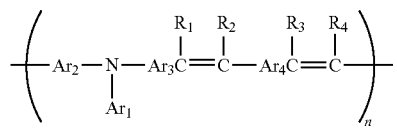

where, in the General Formula (1), $Ar_1$ represents an aromatic hydrocarbon group, and the aromatic hydrocarbon group may be substituted with a substituent; $Ar_2$ and $Ar_3$ each independently represent a bivalent group of a monocyclic aromatic hydrocarbon group, a non-condensed polycyclic aromatic hydrocarbon group, or a condensed polycyclic aromatic hydrocarbon group, which may be substituted with a substituent; $Ar_4$ represents a bivalent group of benzene, thiophene, biphenyl, anthracene, or naphthalene, which may be substituted with a substituent; $R_1$ to $R_4$ each independently represent a hydrogen atom, an alkyl group, or an aryl group; and n represents an integer that is 2 or more and allows the polymer represented by the General Formula (1) to have a weight average molecular weight of 2,000 or more; and General Formula (2)

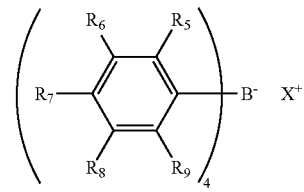

where, in the General Formula (2), $R_5$ to $R_9$, which may be identical to or different from each other, represent a hydrogen atom, a halogen atom, an alkyl group, an alkoxy group, or an aryl group; $X^+$ represents a cation; and $B^-$ represents an anion, and
wherein a mass ratio (A:B) between the polymer A including the recurring unit represented by the General Formula (1) and the compound B represented by the General Formula (2) is from 20:1 through 1:1.

2. The photoelectric conversion element according to claim 1, wherein the electron-transporting layer comprises, on an electron-transporting material on a surface thereof at a side of the photoelectric conversion layer, at least one compound selected from the group consisting of a phosphonic acid compound, a boronic acid compound, a sulfonic acid compound, a halogenated silyl compound, and an alkoxysilyl compound.

3. The photoelectric conversion element according to claim 2, wherein the compound comprises a nitrogen atom.

4. The photoelectric conversion element according to claim 2, wherein the compound is represented by General Formula (3) below:

General Formula (3)

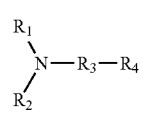

where $R_1$ and $R_2$, which may be identical to or different from each other, represent a hydrogen atom, an alkyl group, an aryl group, or a heterocycle, $R_3$ represents a bivalent alkylene group, a bivalent aryl group, or a bivalent heterocycle, $R_4$ represents a phosphonic acid group, a boronic acid group, a sulfonic acid group, a halogenated silyl group, or an alkoxysilyl group, and $R_1$ or $R_2$, $R_3$, and N may be joined together to form a ring structure.

5. The photoelectric conversion element according to claim 1, wherein the photoelectric conversion element comprises at least one salt selected from the group consisting of an organic salt and an inorganic salt between the photoelectric conversion layer and the hole-transporting layer.

6. The photoelectric conversion element according to claim 5, wherein the salt comprises a halogen atom as an anion.

7. The photoelectric conversion element according to claim 5, wherein the organic salt is a halogenated hydroacid salt of amine, and the inorganic salt is a halide of an alkali metal.

8. The photoelectric conversion element according to claim 1, wherein the photoelectric conversion layer comprises a compound represented by General Formula (4) below:

  General Formula (4)

where a ratio of α:β:γ is 3:1:1; β and γ are each an integer of more than 1; X represents a halogen atom; Y represents an organic compound comprising an amino group; and Z represents a metal ion.

9. The photoelectric conversion element according to claim 1, wherein the photoelectric conversion layer is a perovskite layer comprising a perovskite compound.

10. The photoelectric conversion element according to claim 9, wherein the perovskite layer comprises a Sb atom, a Cs atom, a Rb atom, or a K atom.

11. The photoelectric conversion element according to claim 1, further comprising
an amine compound between the photoelectric conversion layer and the hole-transporting layer, and the amine compound is different from an amine compound in the photoelectric conversion layer.

12. The photoelectric conversion element according to claim 1, wherein the electron-transporting layer comprises a metal oxide.

13. The photoelectric conversion element according to claim 12, wherein the metal oxide is tin oxide.

14. A photoelectric conversion module comprising photoelectric conversion elements that are electrically coupled in series or in parallel, each of the photoelectric conversion elements being the photoelectric conversion element according to claim 1.

15. An electronic device comprising:
the photoelectric conversion module according to claim 14; and
a device configured to be driven by electric power generated through photoelectric conversion of the photoelectric conversion module.

16. An electronic device comprising:
the photoelectric conversion module according to claim 14;
an electricity storage device configured to store electric power generated through photoelectric conversion of the photoelectric conversion module; and
a device configured to be driven by at least one of the electric power generated through photoelectric conversion of the photoelectric conversion module and the electric power stored in the electricity storage device.

17. A power supply module comprising:
the photoelectric conversion module according to claim 14; and
a power supply integrated circuit.

18. The photoelectric conversion element according to claim 1, which is a solar cell.

19. The photoelectric conversion element according to claim 1, wherein polymer A comprises A-05 and wherein compound B comprises B-14:

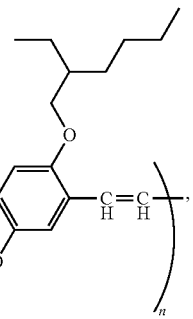

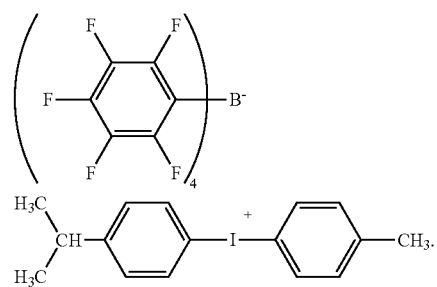

* * * * *